(12) United States Patent
Yamaguchi

(10) Patent No.: US 10,121,895 B2
(45) Date of Patent: Nov. 6, 2018

(54) METHOD FOR PRODUCING SEMICONDUCTOR DEVICE AND SEMICONDUCTOR DEVICE

(71) Applicant: Renesas Electronics Corporation, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/952,956

(22) Filed: Apr. 13, 2018

(65) Prior Publication Data

US 2018/0233592 A1 Aug. 16, 2018

Related U.S. Application Data

(63) Continuation of application No. 15/505,563, filed as application No. PCT/JP2014/081839 on Dec. 2, 2014, now Pat. No. 10,014,410.

(51) Int. Cl.
| | |
|---|---|
| *H01L 29/792* | (2006.01) |
| *H01L 29/78* | (2006.01) |
| *H01L 21/285* | (2006.01) |
| *H01L 29/66* | (2006.01) |

(Continued)

(52) U.S. Cl.
CPC .... *H01L 29/7845* (2013.01); *H01L 21/28518* (2013.01); *H01L 21/28568* (2013.01); *H01L 27/11568* (2013.01); *H01L 27/11573* (2013.01); *H01L 29/665* (2013.01); *H01L 29/66545* (2013.01)

(58) Field of Classification Search
CPC ............... H01L 21/28518; H01L 21/28568
See application file for complete search history.

(56) References Cited

U.S. PATENT DOCUMENTS

| | | | |
|---|---|---|---|
| 2005/0003593 A1 | 1/2005 | Krivokapic | |
| 2014/0227843 A1 | 8/2014 | Tsukamoto et al. | |

FOREIGN PATENT DOCUMENTS

| | | |
|---|---|---|
| JP | 2007-519217 A | 7/2007 |
| JP | 2009-141214 A | 6/2009 |
| JP | 2014-154790 A | 8/2014 |

OTHER PUBLICATIONS

Notice of Allowance dated Mar. 1, 2018 in U.S. Appl. No. 15/505,563.

(Continued)

*Primary Examiner* — Samuel Gebremariam
(74) *Attorney, Agent, or Firm* — McGinn IP Law Group, PLLC.

(57) ABSTRACT

A semiconductor device having a memory cell includes: a first gate electrode formed on a semiconductor substrate via a first insulating film; a second gate electrode formed on the semiconductor substrate via the second insulating film having a charge storage portion inside so as to be adjacent to the first gate electrode; a third insulating film interposed between the first gate electrode and the second gate electrode; a first source/drain region formed on a main surface of the semiconductor substrate; a first silicide layer formed in contact with an upper surface of the first source/drain region; a second silicide layer formed in contact with an upper surface of the first gate electrode; and a third silicide layer formed in contact with an upper surface of the second gate electrode. The first to third silicide layers contain platinum.

8 Claims, 16 Drawing Sheets

(51) Int. Cl.
 *H01L 27/11568* (2017.01)
 *H01L 27/11573* (2017.01)

(56) References Cited

OTHER PUBLICATIONS

International Search Report (ISR) (PCT Form PCT/ISA/210), in PCT/JP2014/081839, dated Mar. 10, 2015.
Japanese Office Action dated Sep. 5, 2017 in Japanese Application No. 2016-562121 with an English translation thereof.

FIG. 23

| | OPERATION METHOD WRITING/ERASING | WRITING OPERATION VOLTAGE (V) Vmg/Vs/Vcg/Vd/Vb | ERASING OPERATION VOLTAGE (V) Vmg/Vs/Vcg/Vd/Vb | READING OPERATION VOLTAGE (V) Vmg/Vs/Vcg/Vd/Vb |
|---|---|---|---|---|
| A | SSI(WRITING)/BTBT(ERASING) | 10/5/1/0.5/0 | -6/6/0/open/0 | 0/0/1.5/1.5/0 |
| B | SSI(WRITING)/FN(ERASING) | 10/5/1/0.5/0 | 12/0/0/0/0 | 0/0/1.5/1.5/0 |
| C | FN(WRITING)/BTBT(ERASING) | -12/0/0/0/0 | -6/6/0/open/0 | 0/0/1.5/1.5/0 |
| D | FN(WRITING)/FN(ERASING) | -12/0/0/0/0 | 12/0/0/0/0 | 0/0/1.5/1.5/0 |

METHOD FOR PRODUCING SEMICONDUCTOR DEVICE AND SEMICONDUCTOR DEVICE

CROSS-REFERENCE TO RELATED APPLICATIONS

The present application is a Divisional Application of U.S. patent application Ser. No. 15/505,563, filed on Feb. 21, 2017, which is a § 371 National Stage of International Application No. PCT/JP2014/081839 filed on Dec. 2, 2014, the entire contents of which are hereby incorporated by reference.

TECHNICAL FIELD

The present invention relates to a method for manufacturing a semiconductor device and a semiconductor device, and the present invention can be utilized for, for example, manufacturing a semiconductor device having a silicide layer.

BACKGROUND ART

As a transistor to be formed in a logic portion of a next generation microcomputer capable of miniaturization, a transistor including a metal gate electrode and a high dielectric constant film (high-k film) is known. As a method for forming such a transistor, so-called a gate-last process is known, the gate-last process forming a dummy gate electrode on a substrate, and then, replacing the dummy gate electrode with a metal gate electrode.

In addition, as an electrically writable/erasable nonvolatile semiconductor memory device, a memory cell including a conductive floating gate electrode or a trapping insulating film surrounded by an oxide film below the gate electrode of the MISFET is widely used. As a nonvolatile semiconductor memory device using the trapping insulating film, a MONOS (Metal Oxide Nitride Oxide Semiconductor) type split gate type cell is cited.

In the gate last process, after a silicide layer is formed on the source/drain region of various MISFETs, an element is covered with an interlayer insulating film, and then, an upper surface of the interlayer insulating film is polished to expose an upper surface of the gate electrode. For this reason, when a silicide layer is formed on a gate electrode configuring a memory cell and being made of a semiconductor film, it is required to perform a process of forming the silicide layer again after the polishing process.

Patent Document 1 (Japanese Patent Application Laid-open Publication No. 2014-154790) describes a case of mixedly mounting the memory cell and the MISFET of the logic portion, in which a silicide layer is formed on a source/drain region of the MISFET, subsequently a metal gate electrode of the MISFET is formed by the gate-last process, and then, a silicide layer is formed on the gate electrode of the memory cell.

RELATED ART DOCUMENT

Patent Document

Patent Document 1: Japanese Patent Application Laid-open Publication No. 2014-154790

SUMMARY OF THE INVENTION

Problems to be Solved by the Invention

If a tensile stress of the silicide layer on the source/drain region of the MISFET can be enhanced, a property of the MISFET can be improved by inducing the tensile stress onto the channel region. On the other hand, when the tensile stress of the silicide layer on the gate electrode of the memory cell is large, the silicide layer tends to be disconnected, and therefore, there is a problem of significant decrease in the operation speed of the element due to the disconnection of the silicide layer.

Other object and novel characteristics of the present invention will be apparent from the description of the present specification and the accompanying drawings.

Means for Solving the Problems

The typical summary of the embodiments disclosed in the present application will be briefly described as follows.

As a method for manufacturing a semiconductor device according to one embodiment, in a case of mixedly mounting the MONOS memory and the MISFET formed by the gate-last process, a silicide layer is formed on a source/drain region by a salicide process with high temperature heat process, and then, a silicide layer is formed on a gate electrode of a MONOS memory by a salicide process with low temperature heat process.

In addition, in a semiconductor device according to another embodiment, an amount of platinum per unit area in a lower surface of the first silicide layer on the source/drain region of each of the MONOS memory and MISFET mixedly mounted on the substrate is larger than an amount of platinum per unit area in a lower surface of the second silicide layer on the gate electrode of the MONOS memory.

Effects of the Invention

According to one embodiment, a performance of a semiconductor device can be improved. Particularly, a property of an element can be improved while a high resistance of a gate electrode is prevented.

BRIEF DESCRIPTIONS OF THE DRAWINGS

FIG. 23 is a table illustrating an example of a voltage application condition to each portion of a selected memory cell at the time of "writing", "erasing", and "reading";

BEST MODE FOR CARRYING OUT THE INVENTION

Figure 1:
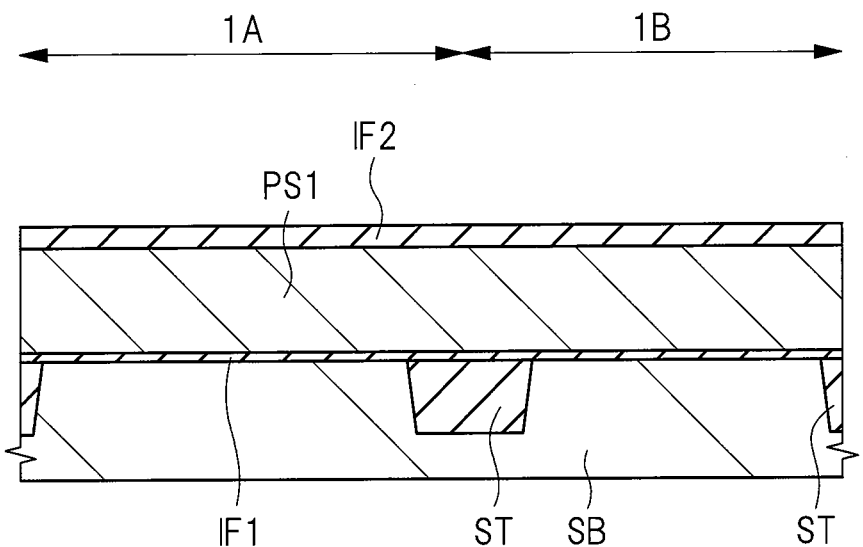
FIG. 1 is a cross-sectional view during a manufacturing process of a semiconductor device of a first embodiment.

Hereinafter, embodiments will be described in detail with reference to the accompanying drawings. Note that components having the same function are denoted by the same reference symbols throughout all the drawings for describing the embodiments, and the repetitive description thereof will be omitted. In addition, in the following embodiments, the descriptions for the same or similar parts are not repeated in principle unless particularly required.

In addition, symbols "−" and "+" represent relative concentrations of impurities whose conductivity type is n-type or p-type. For example, in the case of n-type impurities, the impurity concentrations increase in the order of "n$^{--}$" to "n$^{-}$".

Each semiconductor device of the present embodiment and the following embodiments is a semiconductor device including a nonvolatile memory (a nonvolatile storage element, a flash memory, and a nonvolatile semiconductor storage device). In the present embodiment, the nonvolatile memory will be described based on a memory cell on the basis of an n-channel type MISFET (MISFET: Metal Insulator Semiconductor Field Effect Transistor).

In addition, the polarities (the polarity of the applied voltage and the polarity of the carrier at the time of writing, erasing, and reading) in the present embodiment and the following embodiments are used for describing an operation in a case of a memory cell based on an n-channel type MISFET. In a case based on a p-channel type MISFET, the same operation can be obtained in principle by reversing all the polarities such as the applied potential, the conductivity type of the carrier, and others. In addition, in the present application, the semiconductor film and the silicide layer formed by the reaction between the metal film and the semiconductor film will be described while being distinguished from each other. That is, the silicide described in the present application is a compound of metal and silicon but not a semiconductor.

<Method for Manufacturing Semiconductor Device>

A method for manufacturing a semiconductor device according to the present embodiment will be described with reference to FIGS. 1 to 22.

Each of FIGS. 1 to 22 is a cross-sectional view during the manufacturing process of the semiconductor device of the present embodiment. In FIGS. 1 to 22, the memory cell region 1A is shown on the left side of each drawing, and the peripheral circuit region 1B is shown on the right side thereof. The drawings illustrate states in which a memory cell of the nonvolatile memory is formed in the memory cell region 1A and in which a MISFET is formed in the peripheral circuit region 1B.

Here, a case of forming a memory cell made of an n-channel type MISFET (control transistor and memory transistor) in the memory cell region 1A will be described. However, a memory cell made of a p-channel type MISFET (control transistor and memory transistor) by reversing the conductivity type can be formed in the memory cell region 1A. Similarly, here, a case of forming an n-channel type MISFET in the peripheral circuit region 1B will be described. However, a p-channel type MISFET made by reversing the conductivity type can be formed in the peripheral circuit region 1B.

In addition, both the n-channel type MISFET and the p-channel type MISFET, that is, a CMISFET can be formed in the peripheral circuit region 1B. In addition, the present embodiment will describe formation of a relatively low breakdown voltage MISFET in the peripheral circuit region 1B. However, a high breakdown voltage MISFET having a gate length, a gate insulating film thickness, or others different from that of the low breakdown voltage MISFET is also formed in the peripheral circuit region 1B.

In the manufacturing process of the semiconductor device, first, as shown in FIG. 1, a semiconductor substrate (semiconductor wafer) SB made of p-type single crystal silicon (Si) or others having a specific resistance of, for example, about 1 to 10 Ωcm is prepared. Then, a plurality of element isolation regions ST for defining the active region are formed on the main surface of the semiconductor substrate SB.

The element isolation region ST is made of an insulator such as silicon oxide, and can be formed by, for example, a STI method or a LOCOS method. Here, formation of the element isolation region by the STI method will be described.

That is, after a silicon oxide film and a silicon nitride film are sequentially laminated on the semiconductor substrate SB in this order, the silicon nitride film and the silicon oxide film are etched by using a photolithography technique and a dry etching method, and further, a trench is formed on the upper surface of the semiconductor substrate SB. A plurality of the trenches are formed.

Subsequently, after an insulating film made of, for example, silicon oxide is embedded in these trenches, each insulating film on the semiconductor substrate SB is removed by a polishing process or others, so that a plurality of element isolation regions ST are formed. The element isolation region ST is formed, for example, between the memory cell region 1A and the peripheral circuit region 1B and between the MISFETs formed in the peripheral circuit region 1B. Thus, the structure shown in FIG. 1 is obtained.

Next, although not shown, a p-type well is formed on the main surface of the semiconductor substrate SB in the memory cell region 1A and the peripheral circuit region 1B. The p-type well can be formed by, for example, ion implanting a p-type impurity such as boron (B) into the semiconductor substrate SB. Note that a p-type well to be formed in each formation region of the memory cell, the high breakdown voltage MISFET or the low breakdown voltage MISFET, and others can be formed by the same ion implantation process. However, they can be also formed in the respective regions by different ion implantation processes from each other for optimizing properties of the respective elements.

Figure 2:
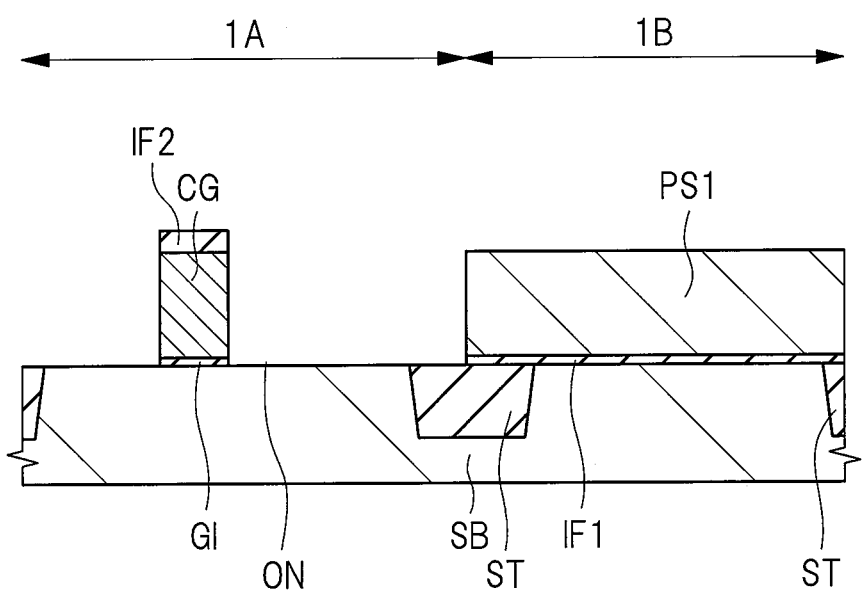
FIG. 2 is a cross-sectional view during the manufacturing process of the semiconductor device, continued from FIG. 1.

Next, as shown in FIG. 2, an insulating film IF1 for a gate insulating film is formed on the main surface of the semiconductor substrate SB. That is, the insulating film IF1 is formed on the upper surface of the semiconductor substrate SB in the memory cell region 1A and the peripheral circuit region 1B. As the insulating film IF1, for example, a silicon oxide film can be used. The insulating film IF1 of each of the memory cell region 1A and the peripheral circuit region 1B may be formed with different thicknesses from each other by the formation in different processes.

Subsequently, a silicon film PS1 made of a polycrystalline silicon film is formed on the semiconductor substrate SB by using, for example, a CVD (Chemical Vapor Deposition) method so as to cover the upper surface of the insulating film IF1. At the time of film formation, the silicon film PS1 is formed as an amorphous silicon film, and then, the silicon film PS1 made of the amorphous silicon film can also be changed to a silicon film PS1 made of a polycrystalline silicon film by the subsequent heat treatment. In addition, the silicon film PS1 can be made as a low-resistance semiconductor film (doped polysilicon film) by the introduction of impurities at the time of film formation or by the ion implantation of impurities after the film formation or others. As the n-type impurity to be introduced into the silicon film PS1, for example, phosphorus (P) can be preferably used.

Subsequently, an insulating film IF2 is formed on the silicon film PS1 by using, for example, a CVD method. The insulating film IF2 is a cap insulating film made of, for example, silicon nitride (SiN). The film thickness of the insulating film IF2 can be, for example, about 20 to 50 nm.

Next, as shown in FIG. 2, the laminated film made of the insulating film IF2, the silicon film PS1, and the insulating film IF1 in the memory cell region 1A is patterned by the photolithography and etching techniques. Thus, a gate insulating film GI made of the insulating film IF1 is formed in the memory cell region 1A. In addition, by this etching process, a control gate electrode CG made of the silicon film PS1 in the memory cell region 1A is formed. The control gate electrode CG is a pattern subjected to the silicidation in a later process to be a control gate electrode. The control gate electrode CG is a pattern extending in a predetermined direction in plan view. The predetermined direction, that is, the gate width direction is the depth direction in FIG. 2.

The above-described patterning process can be performed, for example, as follows. That is, the insulating film IF2, the silicon film PS1, and the insulating film IF1 in the memory cell region 1A are processed by using a photolithography technique and a dry etching method. This forms the control gate electrode CG and the gate insulating film GI. Note that it is also possible to process the insulating film IF2 in the memory cell region 1A first by using a photolithography technique and a dry etching method, and then, to process the silicon film PS1 and the insulating film IF1 by using the insulating film IF2 as a mask.

Figure 3:
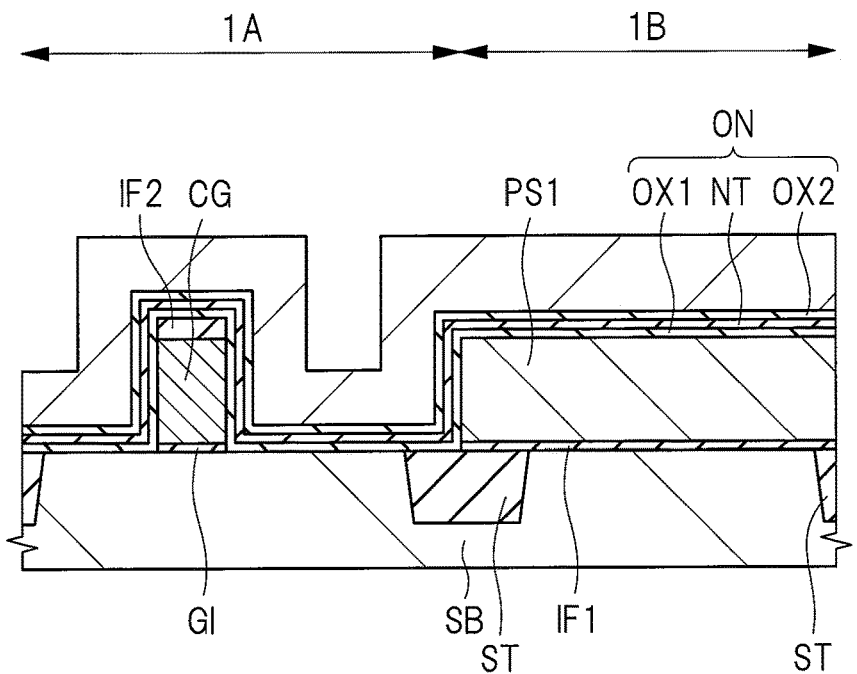
FIG. 3 is a cross-sectional view during the manufacturing process of the semiconductor device, continued from FIG. 2.

Next, as shown in FIG. 3, the insulating film IF2 in the peripheral circuit region 1B is removed by using a photolithography technique and a wet etching method. In this manner, the upper surface of the silicon film PS1 in the peripheral circuit region 1B is exposed. At this stage, the insulating film IF2 in the memory cell region 1A is not removed.

Subsequently, an ONO (Oxide-Nitride-Oxide) film ON for the gate insulating film of the memory transistor is formed on the entire main surface of the semiconductor substrate SB. The ONO film ON covers the upper surface of the semiconductor substrate SB and the sidewall and the upper surface of the laminated film made of the gate insulating films GI and IF2 and the control gate electrode CG in the memory cell region 1A, and covers the sidewall and the upper surface of the laminated film including the insulating film IF1 and the silicon film PS1 in the peripheral circuit region 1B.

The ONO film ON is an insulating film including a charge storage portion therein. Specifically, the ONO film ON is made of a laminated film of a silicon oxide film OX1 formed on the semiconductor substrate SB, a silicon nitride film NT formed on the silicon oxide film OX1, and a silicon oxide film OX2 formed on the silicon nitride film NT.

The silicon oxide films OX1 and OX2 can be formed by, for example, an oxidation treatment (thermal oxidation treatment), a CVD method, or a combination of them. As the oxidation treatment at this stage, ISSG (In-Situ Steam Generation) oxidation can also be used. The silicon nitride film NT can be formed by, for example, a CVD method.

In the present embodiment, a silicon nitride film NT is formed as an insulating film (charge storage layer) configuring a memory cell and having a trap energy level. As the film used as the charge storage layer, although a silicon nitride film is preferable in terms of reliability and others. However, the film is not limited to the silicon nitride film, and a high dielectric constant film (high dielectric constant insulating film) such as an aluminum oxide film (alumina), a hafnium oxide film, or a tantalum oxide film having a dielectric constant higher than that of the silicon nitride film can be used as the charge storage layer or the charge storage portion.

The thickness of the silicon oxide film OX1 can be, for example, about 2 to 10 nm, the thickness of the silicon nitride film NT can be, for example, about 5 to 15 nm, and the thickness of the silicon oxide film OX2 can be, for example, about 2 to 10 nm.

Subsequently, a polycrystalline silicon film PS2 is formed on the entire main surface of the semiconductor substrate SB so as to cover the surface of the ONO film ON by using, for example, a CVD method. In this manner, the sidewall and the upper surface of the ONO film ON exposed in the memory cell region 1A is covered by the silicon film PS2. That is, the silicon film PS2 is formed on the sidewall of the control gate electrode CG via the ONO film ON.

The film thickness of the silicon film PS2 is, for example, 40 nm. At the time of film formation, the silicon film PS2 is formed as an amorphous silicon film, and then, the silicon film PS2 made of the amorphous silicon film can also be changed to a silicon film PS2 made of a polycrystalline silicon film by the subsequent heat treatment. The silicon film PS2 is a film into which, for example, a p-type impurity (for example, boron (B)) is introduced in a comparatively high concentration. The silicon film PS2 is a film for forming the memory gate electrode MG described later.

In the case of a specific film, the term "film thickness" as used herein means the thickness of the film in the direction perpendicular to the surface of the base of the film. For example, when the silicon film PS2 is formed on and along the main surface of the semiconductor substrate SB such as the upper surface of the ONO film ON or others, the film thickness of the silicon film PS2 means the thickness of the silicon film PS2 in a direction perpendicular to the main surface of the semiconductor substrate SB. In addition, in the case of the silicon film PS2 in the portion formed in contact with the wall perpendicular to the main surface of the semiconductor substrate SB such as the sidewall of the ONO film ON, the film thickness of the silicon film PS2 means the thickness of the silicon film PS2 in a direction perpendicular to the sidewall.

Note that FIG. 3 shows the ONO film ON made of a three-layer laminated structure of the silicon oxide film OX1, the silicon nitride film NT, and the silicon nitride film NT. However, in the cross-sectional views used in the following description, the illustration of the laminated structure of the ONO film ON will be omitted for easily understanding. That is, although the ONO film ON has a laminated structure, the illustration of the boundary between the films forming the ONO film ON will be omitted in the drawings used in the following description so that the ONO film ON is shown as one film.

Figure 4:
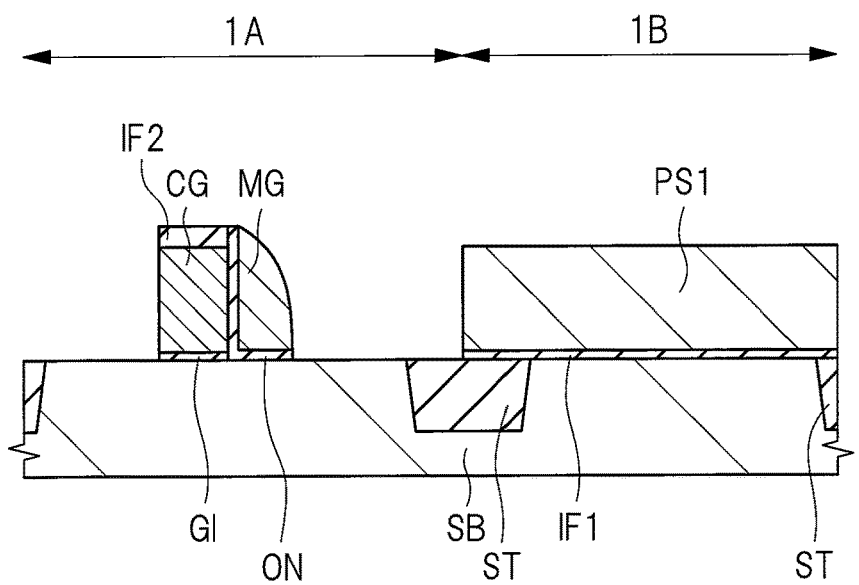
FIG. 4 is a cross-sectional view during the manufacturing process of the semiconductor device, continued from FIG. 3.

Next, as shown in FIG. 4, the silicon film PS2 is etched back (etched, dry-etched, and anisotropically etched) by an anisotropic etching technique, so that the upper surface of the ONO film ON is exposed. In the etching back process, the silicon film PS2 is anisotropically etched (etched back), so that the silicon film PS2 is left as being a sidewall on both sidewalls of the laminated film made of the gate insulating films GI and IF2 and the control gate electrode CG via the ONO film ON.

In this manner, in the memory cell region 1A, a memory gate electrode MG made of the silicon film PS2 left as being the sidewall via the ONO film ON is formed on one sidewall out of the sidewalls of the laminated film. In addition, by the etching back, the upper surface of the ONO film ON in the peripheral circuit region 1B is exposed.

Subsequently, by using a photolithography technique, a resist film (not shown) covering the memory gate electrode MG adjacent to one sidewall of the control gate electrode CG and exposing the silicon film PS2 adjacent to the other sidewall of the control gate electrode CG is formed on the semiconductor substrate SB. Then, by the etching using the resist film as an etching mask, the silicon film PS2 formed on the opposite side of the memory gate electrode MG across the control gate electrode CG is removed. Then, the resist film is removed. In the etching process, the memory gate electrode MG is not etched but left because of being covered with the resist film.

Subsequently, a portion of the ONO film ON, the portion being not covered with the memory gate electrode MG but exposed, is removed by the etching (for example, wet etching). At this stage, in the memory cell region 1A, the ONO film ON directly below the memory gate electrode MG is not removed but left. Similarly, the ONO film ON positioned between the memory gate electrode MG and the laminated film including the gate insulating films GI and IF2 and the control gate electrode CG, is not removed but left. Since the ONO film ON in the other region is removed, the upper surface of the semiconductor substrate SB in the memory cell region 1A is exposed, the upper surface of the laminated film is exposed, and the upper surface of the silicon film PS1 in the peripheral circuit region 1B is exposed. In addition, a sidewall of the control gate electrode CG, the sidewall being not adjacent to the memory gate electrode MG, is exposed.

Thus, the memory gate electrode MG is formed on the semiconductor substrate SB via the ONO film ON including a charge storage portion inside so as to be adjacent to the control gate electrode CG.

Figure 5:
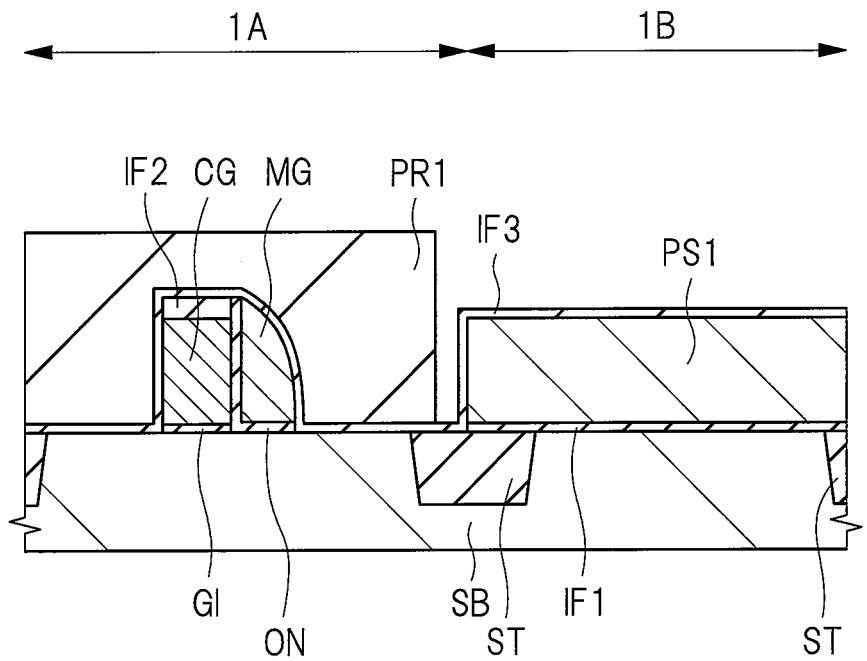
FIG. 5 is a cross-sectional view during the manufacturing process of the semiconductor device, continued from FIG. 4.

Next, as shown in FIG. 5, the insulating film IF3 is formed on the entire main surface of the semiconductor substrate SB by using, for example, a CVD method. The insulating film IF3 is made of, for example, a silicon nitride film. In this manner, the silicon film PS1 in the peripheral circuit region 1B is covered with the insulating film IF3. In addition, the insulating film IF3 covers the laminated film made of the gate insulating film GI, the control gate electrode CG, and the insulating film IF2 in the memory cell region 1A, the ONO film ON and the memory gate electrode MG that are adjacent to the sidewall of the laminated film, and the main surface of the semiconductor substrate SB in the memory cell region 1A. Although not shown, note that a silicon oxide film may be deposited on the entire main surface of the semiconductor substrate SB by using, for example, a CVD method before the formation of the insulating film IF3.

Subsequently, a resist film PR1 to cover the insulating film IF3 in the memory cell region 1A is formed by using a photolithography technique. Note that the insulating film IF3 in contact with each of the upper surface and the sidewall of the silicon film PS1 is exposed from the resist film PR1.

Figure 6:
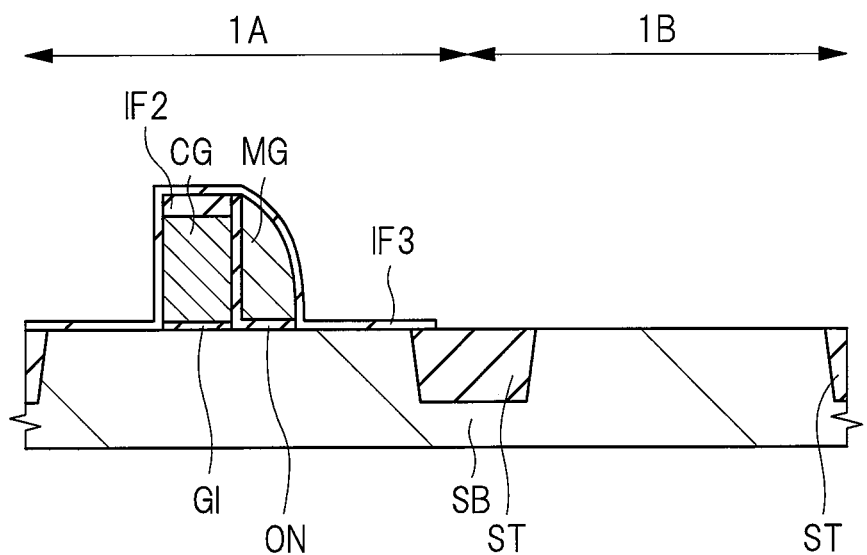
FIG. 6 is a cross-sectional view during the manufacturing process of the semiconductor device, continued from FIG. 5.

Next, as shown in FIG. 6, after the insulating film IF3 exposed from the resist film PR1 is removed by a wet etching method, the resist film PR1 is removed. In this manner, the insulating film IF3 in the peripheral circuit region 1B is removed, so that the silicon film PS1 and the insulating film IF1 are exposed.

Then, the silicon film PS1 and the insulating film IF1 in the peripheral circuit region 1B are removed by using, for example, a wet etching method. At this stage, the laminated film made of the gate insulating film GI, the control gate electrode CG, and the insulating film IF2 in the memory cell region 1A, and the ONO film ON and the memory gate electrode MG that are adjacent to the sidewall of the laminated film in the memory cell region 1A are not removed because of being covered with the insulating film IF3.

Figure 7:
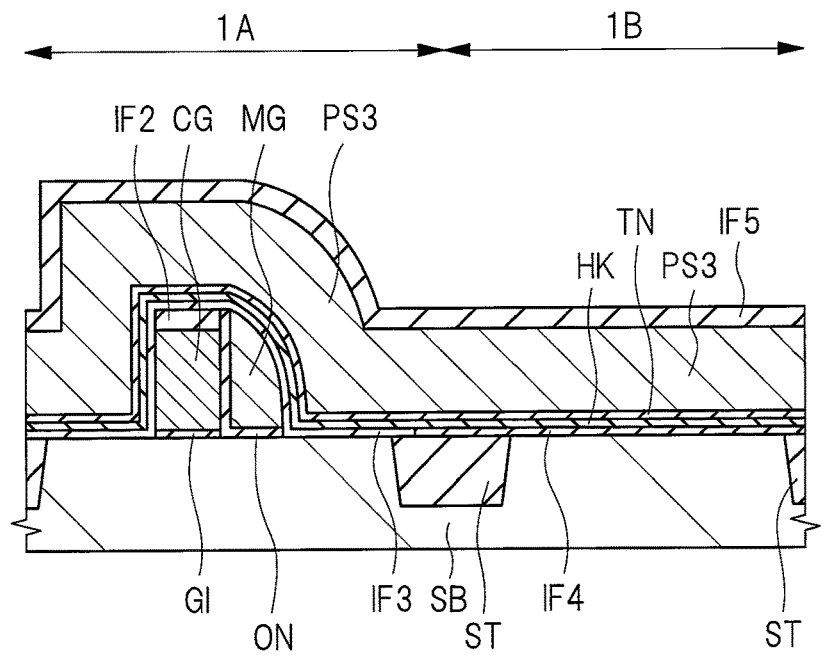
FIG. 7 is a cross-sectional view during the manufacturing process of the semiconductor device, continued from FIG. 6.

Next, as shown in FIG. 7, the insulating films IF4, HK, the metal film TN, the silicon film PS3, and the insulating film IF5 are formed on the entire main surface of the semiconductor substrate SB in this order. In this manner, the laminated film made of the gate insulating film GI, the control gate electrode CG, and the insulating film IF2 in the memory cell region 1A, and the ONO film ON and the memory gate electrode MG that are adjacent to the sidewall of the laminated film are covered with the insulating films IF3, IF4, HK, the metal film TN, the silicon film PS3, and the insulating film IF5.

The insulating film IF4 is made of, for example, a silicon oxide film and can be formed by using an oxidation method such as a thermal oxidation method. The insulating film HK is an insulating film for a gate insulating film. Specifically, the insulating film HK is a film configuring the gate insulating film of the MISFET to be formed in the peripheral circuit region 1B later. The insulating film HK is an insulating material film having a dielectric constant (relative dielectric constant) higher than those of both of silicon oxide and silicon nitride, what is called a high-k film (high dielectric constant film).

As the insulating film HK, metal oxide films such as a hafnium oxide film, a zirconium oxide film, an aluminum oxide film, a tantalum oxide film, or a lanthanum oxide film can be used. And, these metal oxide films can further contain either one or both of nitrogen (N) and silicon (Si). The insulating film HK can be formed by, for example, an ALD (Atomic Layer Deposition) method or others. The film thickness of the insulating film HK is, for example, 1.5 nm. In the case of using a high dielectric constant film (here, the insulating film HK) for the gate insulating film, the physical thickness of the gate insulating film can be larger than that in the case of using the silicon oxide film, and therefore, the case can obtain an advantage that can reduce the leakage current.

The metal film TN is made of, for example, a titanium nitride film, and can be formed by, for example, a sputtering method. The silicon film PS3 is made of a polysilicon film, and then, can be formed by, for example, a CVD method. The film thickness of the silicon film PS3 is, for example, 40 nm. At the time of film formation, after the silicon film PS3 is formed as an amorphous silicon film, the silicon film PS3 made of the amorphous silicon film can also be changed to a silicon film PS3 made of a polycrystalline silicon film by the subsequent heat treatment. The silicon film PS3 is a film into which, for example, a p-type impurity (for example, boron (B)) is introduced in a comparatively high concentration. The silicon film PS3 is a film for forming the dummy gate electrode DG described later. The insulating film IF5 is a cap insulating film made of, for example, silicon nitride, and can be formed by, for example, a CVD method.

Figure 8:
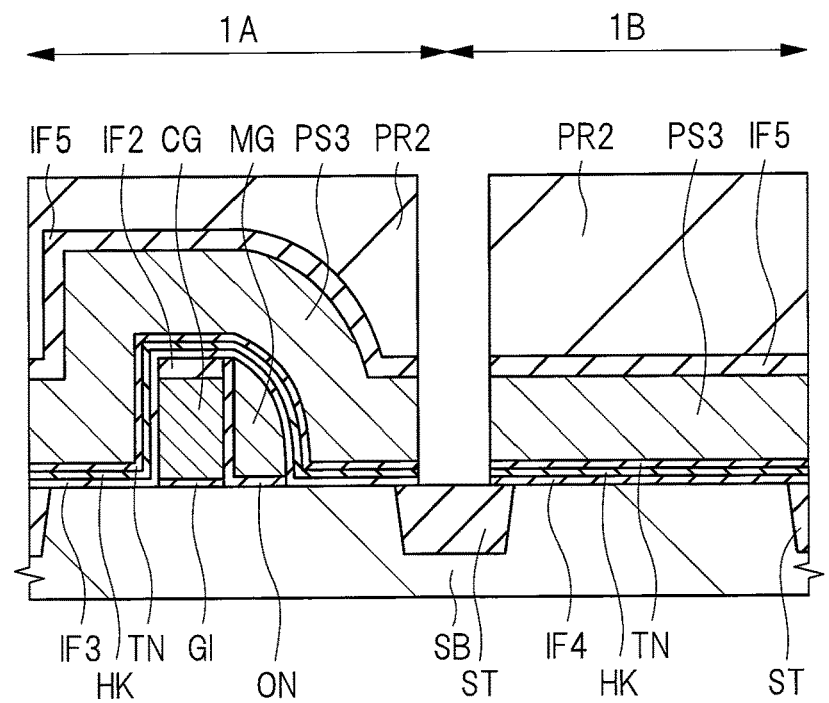
FIG. 8 is a cross-sectional view during the manufacturing process of the semiconductor device, continued from FIG. 7.

Next, as shown in FIG. 8, a resist film PR2 patterned by a photolithography technique is formed. The resist film PR2 is a resist film for exposing the semiconductor substrate SB and the element isolation region ST in the vicinity of the boundary between the memory cell region 1A and the peripheral circuit region 1B. Then, by the etching using the resist film PR2 as a mask, the insulating film IF5, the silicon film PS3, the metal film TN, the insulating film HK, and the insulating film IF4 are removed. In this manner, the silicon film PS3 in the memory cell region 1A and the silicon film PS3 in the peripheral circuit region 1B are separated from each other.

Figure 9:
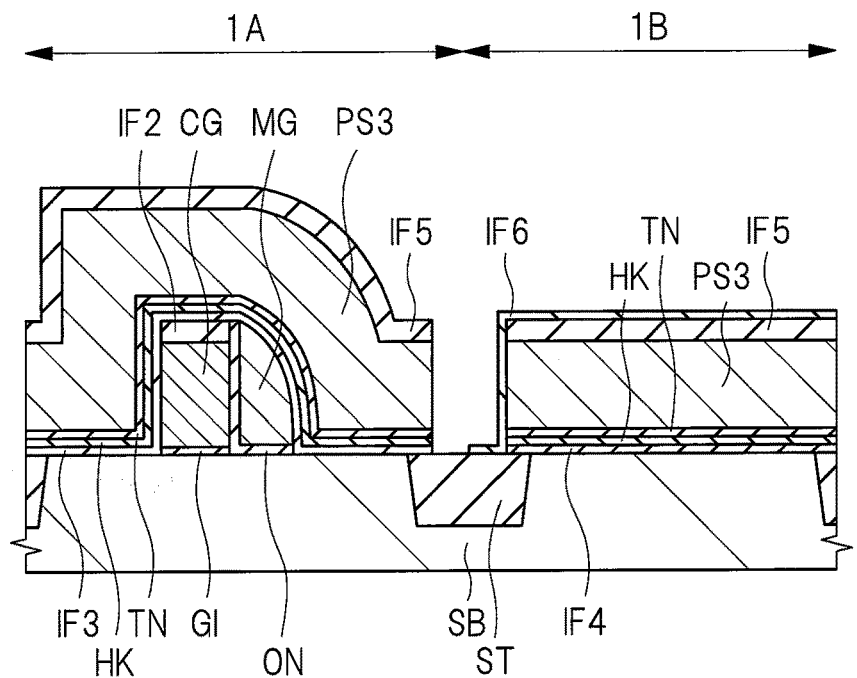
FIG. 9 is a cross-sectional view during the manufacturing process of the semiconductor device, continued from FIG. 8.

Next, as shown in FIG. 9, after the resist film PR2 is removed, the insulating film IF6 is formed on the entire main surface of the semiconductor substrate SB by using, for example, a CVD method. The insulating film IF6 is a cap insulating film made of, for example, a silicon oxide film. Then, the insulating film IF6 in the memory cell region 1A is removed by using a photolithography technique and an etching method. In this manner, the memory cell region 1A is exposed from the insulating film IF6, and the insulating films IF4 and HK, the metal film TN, the silicon film PS3, and the insulating film IF5 in the peripheral circuit region 1B are covered with the insulating film IF6.

Figure 10:
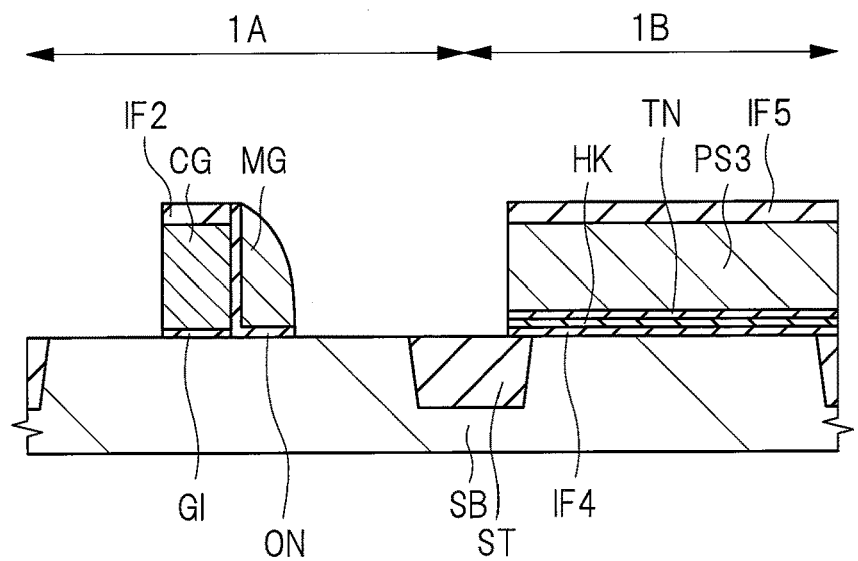
FIG. 10 is a cross-sectional view during the manufacturing process of the semiconductor device, continued from FIG. 9.

Next, as shown in FIG. 10, after the insulating film IF5 and the silicon film PS3 in the memory cell region 1A are removed by using phosphoric acid, the metal film TN and the insulating films HK and IF3 are removed. At this stage, the structure on the semiconductor substrate SB in the peripheral circuit region 1B is not removed because of being covered with a resist film. In this manner, the laminated film made of the gate insulating film GI, the control gate electrode CG, and the insulating film IF2 in the memory cell region 1A, the ONO film ON and the memory gate electrode MG that area adjacent to the sidewall of the laminated film, and the main surface of the semiconductor substrate SB are exposed. Then, the insulating film IF6 in the peripheral circuit region 1B is removed.

Figure 11:
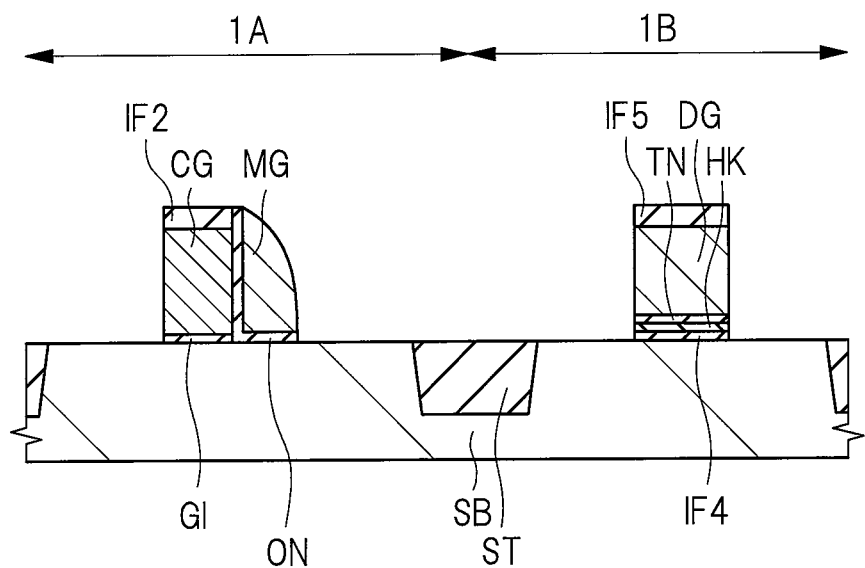
FIG. 11 is a cross-sectional view during the manufacturing process of the semiconductor device, continued from FIG. 10.

Next, as shown in FIG. 11, the insulating film IF5, the silicon film PS3, the metal film TN, and the insulating films HK and IF4 in the peripheral circuit region 1B are patterned by using a photolithography technique and an etching technique. In this manner, the dummy gate electrode DG made of the silicon film PS3 and the gate insulating film made of the insulating films HK and IF4 are formed in the region where the MISFET configuring the peripheral circuit is to be formed. Here, first, the insulating film IF5 is patterned by using a photolithography technique and an etching method, and then, the etching using the insulating film IF5 as a mask is performed while the memory cell region 1A is covered with a resist film, so that the silicon film PS3, the metal film TN, and the insulating films HK and IF4 are patterned.

Figure 12:
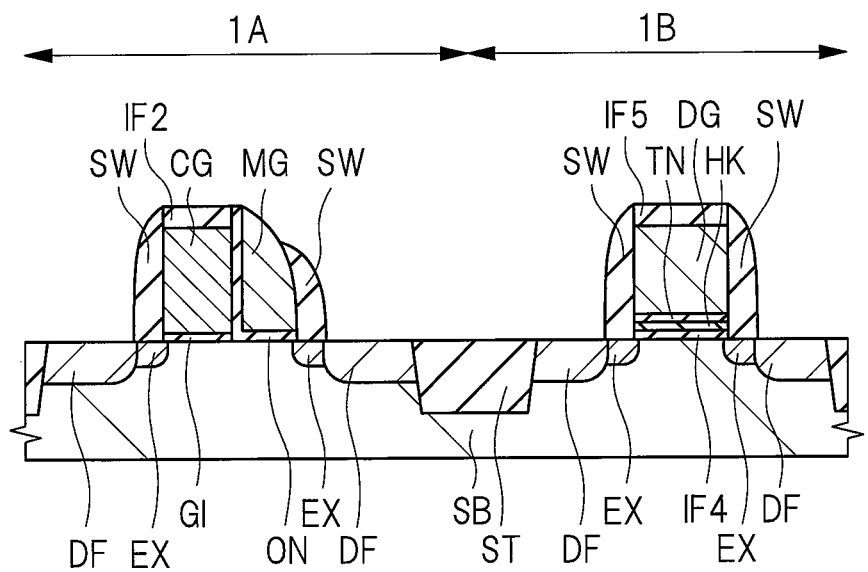
FIG. 12 is a cross-sectional view during the manufacturing process of the semiconductor device, continued from FIG. 11.

Next, as shown in FIG. 12, a plurality of extension regions ($n^-$-type semiconductor region and impurity diffusion region) EX are formed by using an ion implantation method or others. That is, the plurality of extension regions EX are formed by introducing n-type impurities such as arsenic (As) or phosphorus (P) into the semiconductor substrate SB using the gate insulating film GI, the control gate electrode CG, the memory gate electrode MG, the dummy gate electrode DG, the ONO film ON, and others as a mask by an ion implantation method. Before the formation of the extension regions EX, an offset spacer covering each of the sidewall of the structure including the gate insulating film GI, the control gate electrode CG, the insulating film IF2, the ONO film ON, and the memory gate electrode MG and the sidewall of the dummy gate electrode DG may be formed by, for example, a silicon nitride film, a silicon oxide film, a laminated film of them, or others.

Although each of the extension regions EX in the memory cell region 1A and the peripheral circuit region 1B can be formed by the same ion implantation process as each other, it can also be formed by a different ion implantation process from each other. Although the illustration is omitted, a halo region may be formed by, for example, the implantation of p-type impurities (for example, boron (B)) using the insulating film IF5 and the dummy gate electrode DG as a mask into the main surface of the semiconductor substrate SB in the peripheral circuit region 1B before or after the formation process of the extension regions EX. The halo region is formed on a part of the main surface of the semiconductor substrate SB directly below a portion, the part being closer to the center of the dummy gate electrode DG than the extension region EX, that is, the part being closer to the channel region of the MISFET to be formed in the peripheral circuit region 1B in a later process. By the formation of the halo region, the short channel properties of the MISFET can be improved.

Subsequently, a sidewall SW for covering sidewalls on both sides of the structure including the control gate electrode CG and the memory gate electrode MG in the memory cell region 1A is formed. In addition, by the same process, the sidewall SW for covering the sidewalls on both sides of the laminated film made of the gate insulating film GI, the insulating film HK, the metal film TN, the dummy gate electrode DG, and the insulating film IF5 is formed in the peripheral circuit region 1B.

For example, a silicon oxide film and a silicon nitride film are formed on the semiconductor substrate SB by using a CVD method or others in this order, and then, the silicon oxide film and the silicon nitride film are partially removed by anisotropic etching, and the upper surface of the semiconductor substrate SB and the upper surfaces of the insulating films IF2 and IF5 are exposed, so that the sidewall SW can be formed in self alignment. That is, while the sidewall SW can be considered to be formed of a laminated film, an interface between the films configuring the laminated film is not shown in the drawing.

Subsequently, the diffusion region ($n^+$-type semiconductor region, impurity diffusion region) DF is formed in the memory cell region 1A and the peripheral circuit region 1B by using an ion implantation method and others. That is, the diffusion region DF can be formed by introducing n-type impurities (for example, arsenic (As) or phosphorus (P)) into the semiconductor substrate SB by an ion implantation method using the gate insulating film GI, the control gate electrode CG, the insulating film IF2, the ONO film ON, the memory gate electrode MG, the dummy gate electrode DG, and the sidewall SW as a mask. The diffusion region DF has a higher impurity concentration and a deeper junction depth than those of the extension region EX.

In this manner, a source/drain region having an LDD (Lightly Doped Drain) structure made of an extension region EX and a diffusion region DF having an impurity concentration higher than that of the extension region EX is formed.

In the memory cell region 1A, the extension region EX and the diffusion region DF formed on the upper surface of the semiconductor substrate SB at a lateral position of the structure including the control gate electrode CG and the memory gate electrode MG configure the source/drain region of the control transistor and the memory transistor in the memory cell region 1A to be formed later. In addition, in the peripheral circuit region 1B, the extension region EX and the diffusion region DF formed on the upper surface of the semiconductor substrate SB at a lateral position of the dummy gate electrode DG configure the source/drain region of the MISFET in the peripheral circuit region 1B to be formed later. Although each of the diffusion regions DF in the memory cell region 1A and the peripheral circuit region 1B can be formed by the same ion implantation process as each other, it can also be formed by a different ion implantation process from each other.

Subsequently, an activation annealing which is a heat treatment for activating impurities introduced into semiconductor regions for a source and a drain (extension region EX and diffusion region DF) and others is performed.

Figure 13:
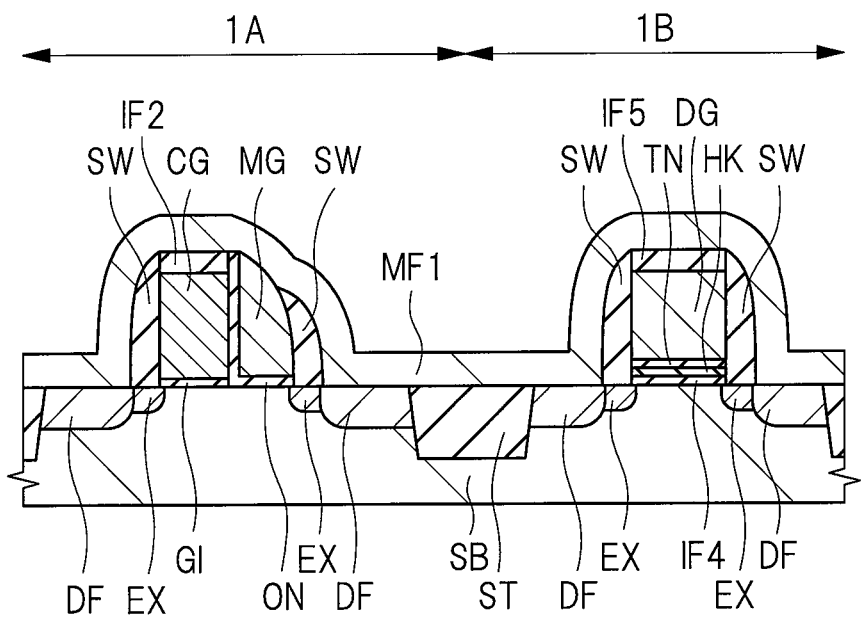
FIG. 13 is a cross-sectional view during the manufacturing process of the semiconductor device, continued from FIG. 12.
Figure 14:
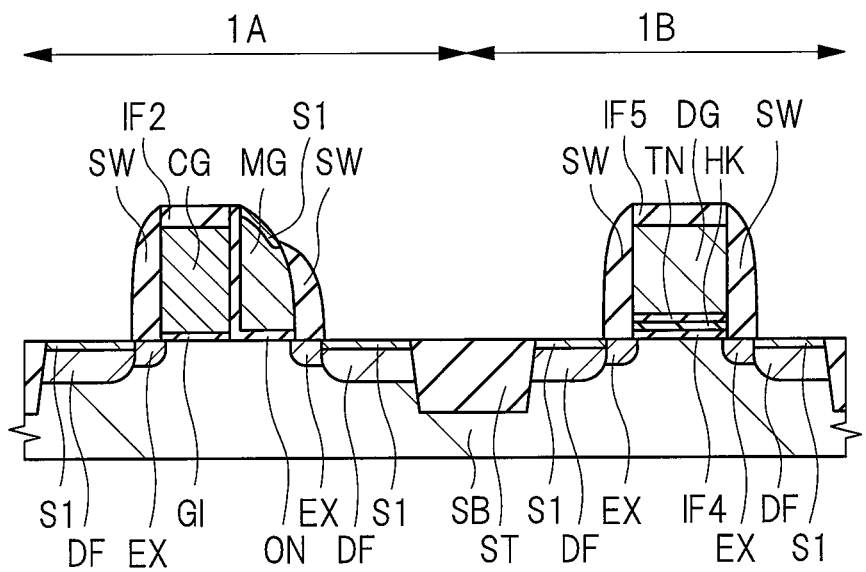
FIG. 14 is a cross-sectional view during the manufacturing process of the semiconductor device, continued from FIG. 13.

Next, so-called a salicide (Self Aligned Silicide) process to be described with reference to FIGS. 13 and 14 is performed, so that a silicide layer is formed. Specifically, the silicide layer can be formed as follows.

That is, as shown in FIG. 13, the chemical dry etching on the main surface of the semiconductor substrate SB is performed as pretreatment, so that an excessive silicon oxide film and others on the semiconductor substrate SB is removed to expose the surface of the semiconductor. Subsequently, a metal film MF1 for forming a silicide layer is formed (deposited) on the entire main surface of the semiconductor substrate SB including the upper surface of the diffusion region DF and the upper surface of the memory gate electrode MG. The film thickness of the metal film MF1 is, for example, 20 to 25 nm.

The metal film MF1 is made of, for example, an alloy film of nickel (Ni) and platinum (Pt), and can be formed by using a sputtering method and others. The metal film MF1 formed here is an alloy film containing nickel, and the material added to nickel in the alloy film is not limited to platinum but may be aluminum (Al), carbon (C), or others. However, since platinum has higher heat resistance than that of aluminum or carbon, platinum can be preferably used for the alloy film.

Next, as shown in FIG. 14, heat treatment is performed to the semiconductor substrate SB so that each surface layer portion of the diffusion region DF and the memory gate electrode MG reacts with the metal film MF1. By this reaction, that is, the silicidation, a silicide layer S1 is formed on an upper portion of each of the diffusion region DF and the memory gate electrode MG. In addition, the metal film MF1 which has not reacted even by the above-described heat treatment is removed by the wet etching and others.

In the heat treatment, a heat treatment device for heating the semiconductor substrate through a carbon heater is used. Here, the heat treatment includes two heat treatment processes. That is, in the first heat treatment, a silicide layer S1 containing NiSi microcrystals and $Ni_2Si$ is formed by, for example, the heating at 260° C. for 30 to 120 seconds. Then, after the unreacted metal film MF1 is removed by wet etching and others as described above, the heating for 5 to 30 seconds at 600° C. is further performed in the second heat treatment, so that the NiSi crystal in the silicide layer S1 is grown. Thus, the heat treatment is performed in the two separate processes as described above, so that the silicide layer S1 can be prevented from abnormally growing and extending in the semiconductor substrate SB. The formed silicide layer S1 as described above is made of, for example, nickel platinum (NiPt) silicide.

Here, among the heat treatment performed twice in the heat treatment, the second heat process is referred to as the first heat treatment for convenience. The first heat treatment is performed at, for example, 450 to 600° C. In the present embodiment, the first heat treatment is performed at 600° C. as described above. Note that the first heat treatment may be performed by using a laser beam or a flash lamp. In addition, the unreacted metal film MF1 may be removed after the first heat treatment.

Thus, since the first heat treatment is performed at a very high temperature, platinum in the silicide layer S1 segregates at the bottom of the silicide layer S1. That is, platinum in the silicide layer S1 exists on the bottom surface of the silicide layer S1 extremely more than the upper surface of the silicide layer S1. In addition, the silicide layer S1 thus formed by the heat treatment at a relatively high temperature has a relatively large tensile stress.

Note that the upper surface of the control gate electrode CG is covered with the insulating film IF2 which is a cap film, and therefore, the silicide layer S1 is not formed on the upper portion of the control gate electrode CG. Similarly, the upper portion of the dummy gate electrode DG in the peripheral circuit region 1B is also covered with the insulating film IF5 which is a cap film, and therefore, the silicide layer S1 is not formed on the upper portion of the dummy gate electrode DG. In addition, the upper portion of the sidewall-shaped memory gate electrode MG is exposed, and therefore, the silicide layer S1 is formed on the exposed portion. However, the silicide layer S1 is completely removed by a polishing process by a CMP (Chemical Mechanical Polishing) method performed in a later process.

Figure 15:
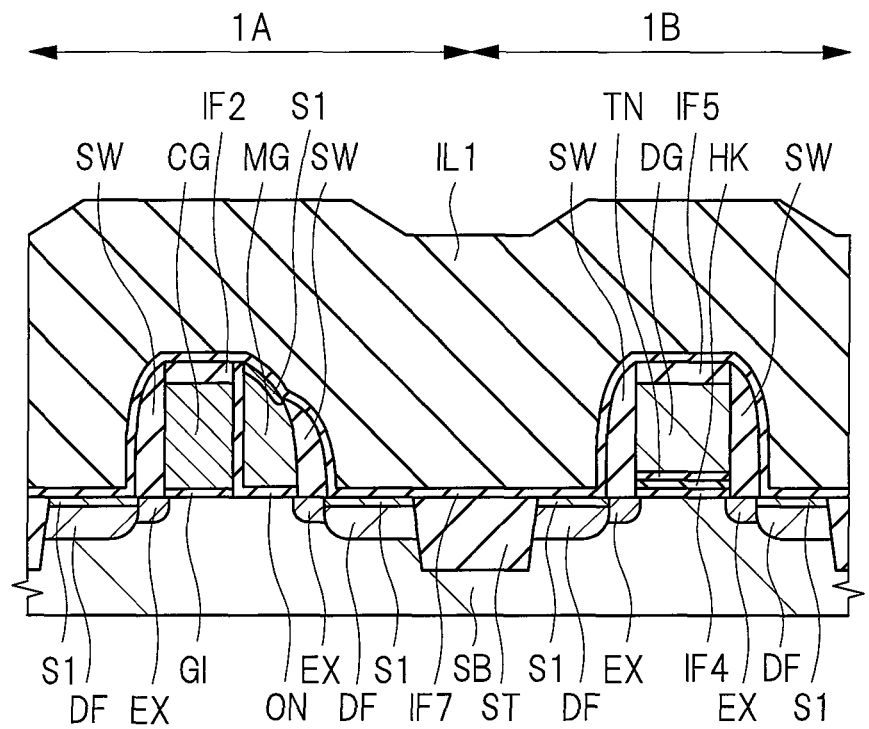
FIG. 15 is a cross-sectional view during the manufacturing process of the semiconductor device, continued from FIG. 14.

Next, as shown in FIG. 15, an insulating film (liner insulating film) IF7 and an interlayer insulating film IL1 are formed on the entire main surface of the semiconductor substrate SB in this order so as to cover the control gate electrode CG, the memory gate electrode MG, the dummy gate electrode DG, and the sidewall SW. The insulating film IF7 is made of, for example, a silicon nitride film, and can be formed by, for example, a CVD method. The insulating film IF7 can be used as an etching stopper film when a contact hole is formed in a later process. The interlayer insulating film IL1 is made of, for example, a single film of a silicon oxide film, and can be formed by, for example, a CVD method or others. Here, the interlayer insulating film IL1 is formed with, for example, a film thickness larger than the film thickness of the control gate electrode CG.

Figure 16:
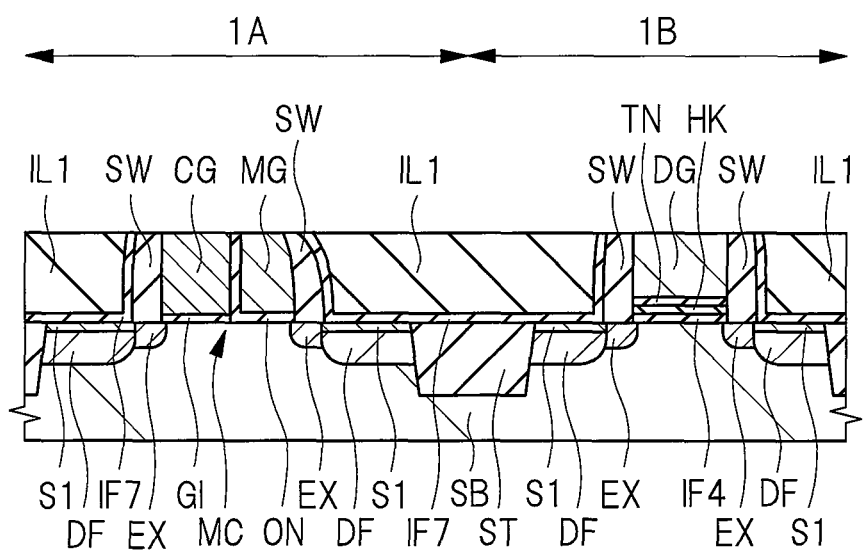
FIG. 16 is a cross-sectional view during the manufacturing process of the semiconductor device, continued from FIG. 15.

Next, as shown in FIG. 16, the upper surface of the interlayer insulating film IL1 is polished by using a CMP method or others. In this manner, the upper surface of each of the control gate electrode CG, the memory gate electrode MG, and the dummy gate electrode DG is exposed. That is, in this polishing process, the interlayer insulating film IL1 and the insulating film IF7 are polished until the upper surface of each of the control gate electrode CG, the memory gate electrode MG, and the dummy gate electrode DG is exposed. In this manner, the insulating films IF2 and IF5 are removed, and the upper portion of each of the sidewall SW and the ONO film ON is partially removed. In addition, by this process, the silicide layer S1 on the memory gate electrode MG is removed together with a part of the upper portion of the memory gate electrode MG.

As a result, the shapes of the control gate electrode CG and the memory gate electrode MG are processed, so that a memory cell MC of a split gate type MONOS memory including the control gate electrode CG, the ONO film ON, the memory gate electrode MG, and the source/drain region in the memory cell region 1A is formed. The memory cell MC which is a MONOS type nonvolatile memory element is formed of a control transistor and a memory transistor.

That is, in the memory cell region 1A, a control transistor is configured of the control gate electrode CG and a pair of source/drain regions formed on the upper surface of the semiconductor substrate SB at a lateral position of the control gate electrode CG. In addition, in the memory cell region 1A, a memory transistor is configured of the memory gate electrode MG and a pair of source/drain regions formed on the upper surface of the semiconductor substrate SB at a lateral position of the memory gate electrode MG. In addition, the ONO film ON below the memory gate electrode MG configures the gate insulating film of the memory transistor. Thus, the control transistor and the memory transistor share the pair of source/drain regions.

Note that the control transistor is a transistor for selecting the memory cell, and therefore, the control transistor can also be regarded as a selection transistor. For this reason, the control gate electrode CG can also be regarded as a selection gate electrode. The memory transistor is a transistor for storage.

Figure 17:
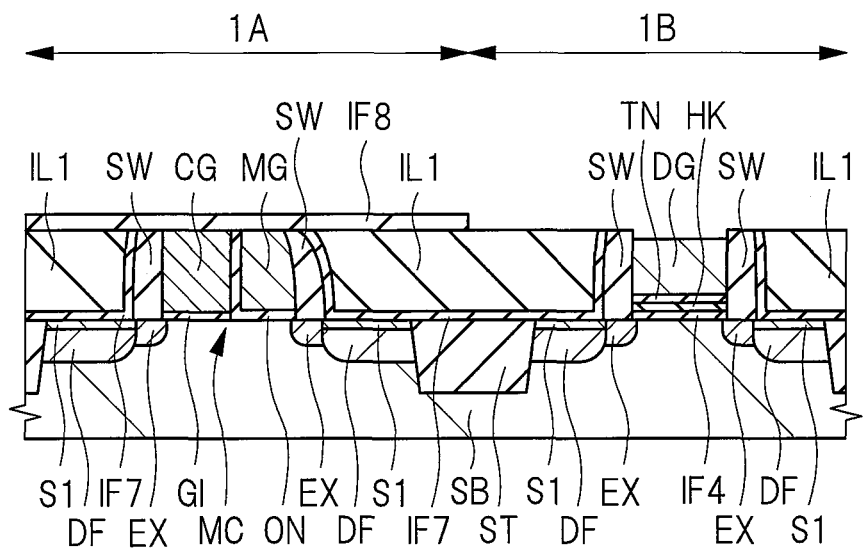
FIG. 17 is a cross-sectional view during the manufacturing process of the semiconductor device, continued from FIG. 16.

Next, as shown in FIG. 17, after the insulating film IF8 is formed on the interlayer insulating film IL1 by using, for example, a CVD method, the insulating film IF8 in the peripheral circuit region 1B is removed by using a photolithography technique and an etching method. As a result, the insulating film IF8 is left in the memory cell region 1A. That is, the insulating film IF8 covers the upper surfaces of the control gate electrode CG and the memory gate electrode MG, and exposes the upper surface of the dummy gate electrode DG. The insulating film IF8 is made of, for example, a silicon oxide film.

Subsequently, the upper surface of the dummy gate electrode DG in the peripheral circuit region 1B which is exposed from the insulating film IF8 is etched back to dent. Thus, the film on the upper surface of the dummy gate electrode DG can be removed by the removal of a part of the upper portion of the dummy gate electrode DG, so that the dummy gate electrode DG can be easily removed in the etching process described later with reference to FIG. 18.

Figure 18:
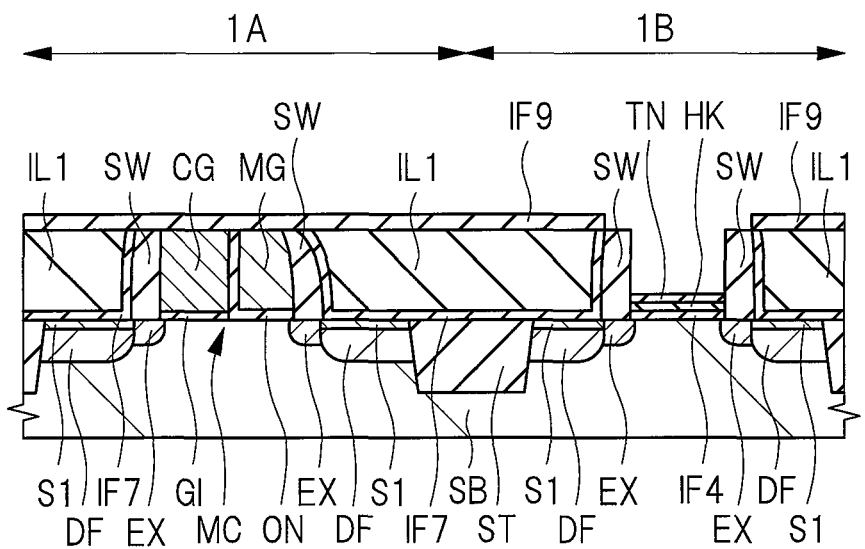
FIG. 18 is a cross-sectional view during the manufacturing process of the semiconductor device, continued from FIG. 17.

Next, as shown in FIG. 18, after the insulating film IF9 is formed on the interlayer insulating film IL1 by using, for example, a CVD method, the insulating film IF9 is processed by using a photolithography technique and an etching method. As a result, the insulating film IF9 covers the memory cell region 1A, and covers the interlayer insulating film IL1 in the peripheral circuit region 1B. That is, the insulating film IF9 covers the upper surfaces of the control gate electrode CG and the memory gate electrode MG, and exposes the upper surface of the dummy gate electrode DG. The insulating film IF9 is made of, for example, a silicon oxide film. Note that the drawing is omitted here. However, the insulating film IF8 (see FIG. 18) may be not removed but left between the insulating film IF9 and the interlayer insulating film IL1.

Then, the dummy gate electrode DG is removed by a wet etching method. Here, by using the insulating film IF9 as a mask for protecting the control gate electrode CG and the memory gate electrode MG, the wet etching using, for example, an alkaline aqueous solution, is performed, so that the dummy gate electrode DG is removed. As the alkaline aqueous solution, for example, ammonia water (NH$_4$OH) is used. By the removal of the dummy gate electrode DG, a trench (concave portion, recessed portion) is formed on the insulating films IF4 and HK configuring the gate insulating film. The trench on the insulating film HK in the peripheral circuit region 1B is a region where the dummy gate electrode DG is removed, and the sidewalls on both sides of the trench are configured by the sidewall SW.

Figure 19:
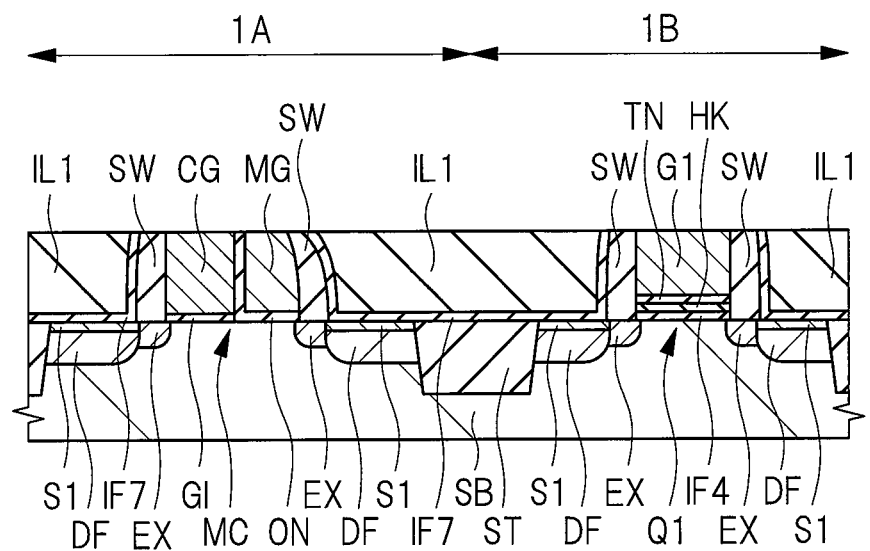
FIG. 19 is a cross-sectional view during the manufacturing process of the semiconductor device, continued from FIG. 18.

Next, as shown in FIG. 19, a metal film is formed as a conductive film for the gate electrode so as to completely fill the trench on the semiconductor substrate SB, that is, on the interlayer insulating film IL1 including the inner surface (the bottom surface and the sidewall) of the trench. Note that although the metal film is considered to have a structure in which, for example, two or more metal films are laminated, the illustration of the boundary between the two or more metal films is omitted in the figure, and the metal film is shown as one film.

In the formation process of the metal film, the inside of the trench is completely filled. In addition, the metal film is also formed on the interlayer insulating film IL1. As the metal film, for example, a titaniumnitride (TiN) film, a tantalumnitride (TaN) film, a tungsten nitride (WN) film, a titanium carbide (TiC) film, a tantalum carbide (TaC) film, a tungsten carbide (WC) film, a tantalum carbide nitride (TaCN) film, a titanium (Ti) film, a tantalum (Ta) film, a titanium aluminum (TiAl) film, an aluminum (Al) film, or others can be used. Note that the term "metal film" described here means a conductive film exhibiting metallic conduction, and includes not only a single metal film (pure metal film) or an alloy film, but also a metallic compound film exhibiting the metallic conduction. The metal film can be formed by using, for example, a sputtering method or others.

Here, for example, the metal film can be formed of, for example, a laminated film of a titanium nitride (TiN) film and an aluminum (Al) film on the titanium nitride film. At this stage, it is preferable to make the aluminum film thicker than the titanium nitride film. Since the aluminum film has low resistance, the resistance of the gate electrode GI to be formed later can be reduced.

Then, the metal film is embedded into the trench by polishing the unnecessary metal film, the insulating film IF9, and others outside each of the above-described trenches by a CMP method or others so as to remove the films. In this manner, the control gate electrode CG and the memory gate electrode MG are exposed. In addition, the gate electrode G1 is formed of the metal film embedded in the trench on the insulating film IF4 in the peripheral circuit region 1B. In this manner, the MISFET Q1 is formed in the peripheral circuit region 1B. The MISFET Q1 includes a gate electrode G1 and a source/drain region at a lateral position of the gate electrode. The MISFET Q1 is, for example, a field effect transistor configuring a peripheral circuit of the memory cell MC.

The insulating film HK and the insulating film IF4 directly below the gate electrode G1 form the gate insulating film of the MISFET Q1. The gate electrode G1 is a metal gate electrode. In the present embodiment, the dummy gate electrode DG (see FIG. 17) is removed and replaced with the gate electrode G1. Therefore, the dummy gate electrode DG is a false gate electrode, and can be regarded as a gate electrode for replacement.

Thus, in the present embodiment, the MISFET Q1 is formed by using a method of forming a dummy gate electrode DG on the semiconductor substrate SB, forming a source/drain region in the semiconductor substrate SB, and then, replacing the dummy gate electrode with a metal gate electrode, that is, by using the gate-last process. In addition, in the present embodiment, since the gate electrode G1 is used as the metal gate electrode, the transistor element can be downsized (the gate insulating film can be thinned).

Next, as will be described with reference to FIGS. 20 and 21, by performing a salicide process, a silicide layer is formed on each electrode made of a polysilicon film. Specifically, the silicide layer can be formed as follows.

Figure 20:
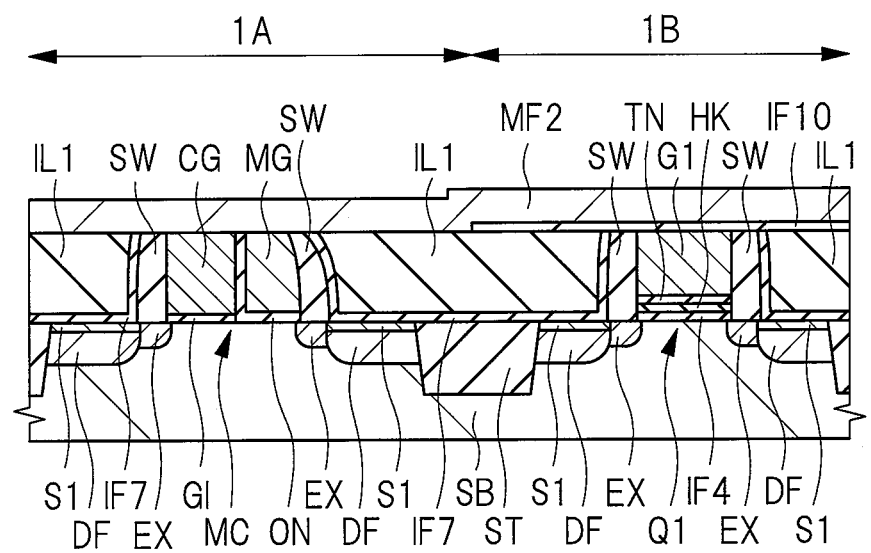
FIG. 20 is a cross-sectional view during the manufacturing process of the semiconductor device, continued from FIG. 19.

That is, as shown in FIG. 20, a pattern of the insulating film IF10 covering the peripheral circuit region 1B is formed by using, for example, a CVD method, a photolithography technique, and an etching method. The insulating film IF10 is an insulating film for exposing the upper surfaces of the control gate electrode CG and the memory gate electrode MG in the memory cell region 1A and for covering the gate electrode GI, and is made of, for example, a silicon oxide film or others.

Subsequently, by performing chemical dry etching onto the main surface of the semiconductor substrate SB as pretreatment, an excessive silicon oxide film or others on the control gate electrode CG and the memory gate electrode MG is removed to expose the surface of the semiconductor. Subsequently, a metal film MF2 for forming a silicide layer is formed (deposited) on the entire main surface of the semiconductor substrate SB including the upper surface of each of the control gate electrode CG and the memory gate electrode MG. The film thickness of the metal film MF2 is, for example, 20 to 25 nm.

The metal film MF2 is made of, for example, an alloy film of nickel (Ni) and platinum (Pt), and can be formed by using a sputtering method or others. The metal film MF2 formed at this stage is an alloy film containing nickel, and the material added to nickel in the alloy film is not limited to platinum, and may be aluminum (Al), carbon (C), or others. However, platinum has higher heat resistance than that of aluminum or carbon, and therefore, can be preferably used for the alloy film.

Figure 21:
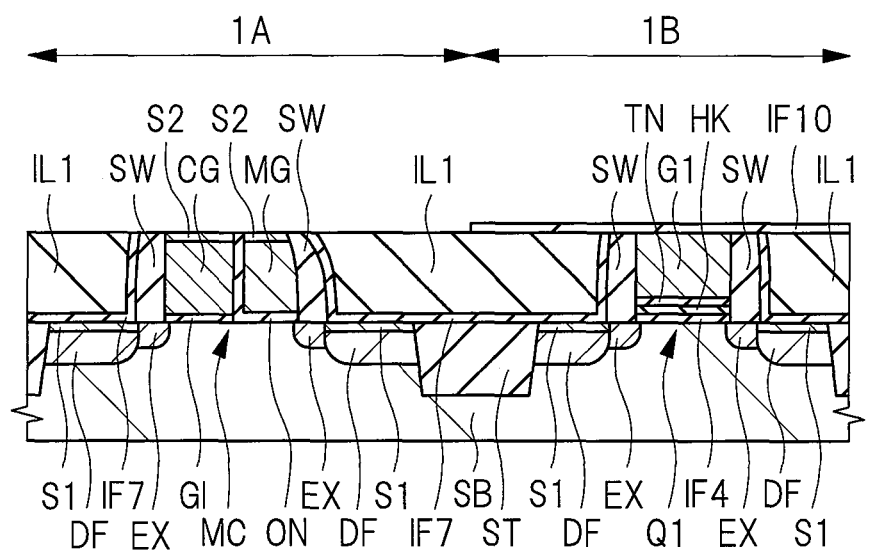
FIG. 21 is a cross-sectional view during the manufacturing process of the semiconductor device, continued from FIG. 20.

Next, as shown in FIG. 21, by performing heat treatment onto the semiconductor substrate SB, each surface layer portion of the control gate electrode CG and the memory gate electrode MG is reacted with the metal film MF2. By the silicidation, a silicide layer S2 is formed on an upper portion of each of the control gate electrode CG and the memory gate electrode MG. In addition, a part of the metal film MF2 that has not reacted even by the above-described heat treatment is removed by the wet etching or others. At this stage, the gate electrode G1 made of a metal film is not removed because of being protected by the insulating film IF10.

In the heat treatment, a heat treatment device for heating the semiconductor substrate through a carbon heater is used. Here, the heat treatment includes two heat treatment processes. That is, in the first heat treatment, a silicide layer S2 containing NiSi microcrystals and $Ni_2Si$ is formed by, for example, the heating at 260° C. for 30 to 120 seconds. Then, after the unreacted metal film MF2 is removed by wet etching and others as described above, the heating for 10 to 120 seconds at 400° C. is further performed in the second heat treatment, so that the NiSi crystal in the silicide layer S2 is grown. The formed silicide layer S2 as described above is made of, for example, nickel platinum (NiPt) silicide.

Here, among the heat treatment performed twice in the heat treatment, the second heat process is referred to as the second heat treatment for convenience. The second heat treatment is performed at, for example, 400° C. or lower. In the present embodiment, the second heat treatment is performed at 400° C. as described above. Note that the unreacted metal film MF2 may be removed after the second heat treatment.

The platinum in the silicide layer S2 formed by the second heat treatment segregates at the bottom of the silicide layer S2. That is, platinum in the silicide layer S2 exists on the bottom surface of the silicide layer S2 more than the upper surface of the silicide layer S2. In addition, the silicide layer S2 thus formed by the heat treatment at a lower temperature than that of the first heat treatment has a relatively small tensile stress.

Here, since the silicide layer S1 formed on the source/drain region in the process (first heat treatment) described with reference to FIGS. 13 and 14 is formed at a relatively high temperature of about 450 to 600° C., most of platinum (Pt) in the silicide layer S1 segregates at a lower part of the silicide layer S1. On the other hand, since the silicide layer S2 formed on the control gate electrode CG and the memory gate electrode MG in the process (second heat treatment) described with reference to FIGS. 20 and 21 is formed at a relatively low temperature of 400° C. or lower, the segregation amount of platinum (Pt) at the lower part of the silicide layer S2 is relatively small.

That is, the segregation amount of platinum (Pt) at the lower part of the silicide layer S2 is smaller than the segregation amount of platinum (Pt) at the lower part of the silicide layer S1. In other words, each of the silicide layers S1 and S2 has a larger amount of platinum (Pt) at the lower surface than the upper surface, and the amount of platinum (Pt) per unit area at the lower surface of the silicide layer S1 is larger than the amount of platinum (Pt) per unit area at the lower surface of the silicide layer S2. In addition, the amount of platinum (Pt) per unit area at the upper surface of the silicide layer S1 is smaller than the amount of platinum (Pt) per unit area at the upper surface of the silicide layer S2.

Thus, the difference in the segregation amount of platinum (Pt) between the silicide layers S1 and S2 is made by the difference in the temperature of the heat treatment performed for forming each of the silicide layers. In addition, the tensile stress of the silicide layer S2 formed by the second heat treatment at a temperature lower than that of the first heat treatment is smaller than the tensile stress of the silicide layer S1 formed by the first heat treatment. Therefore, the silicide layer S2 has a feature that is more difficult to be disconnected than the silicide layer S1.

Figure 22:
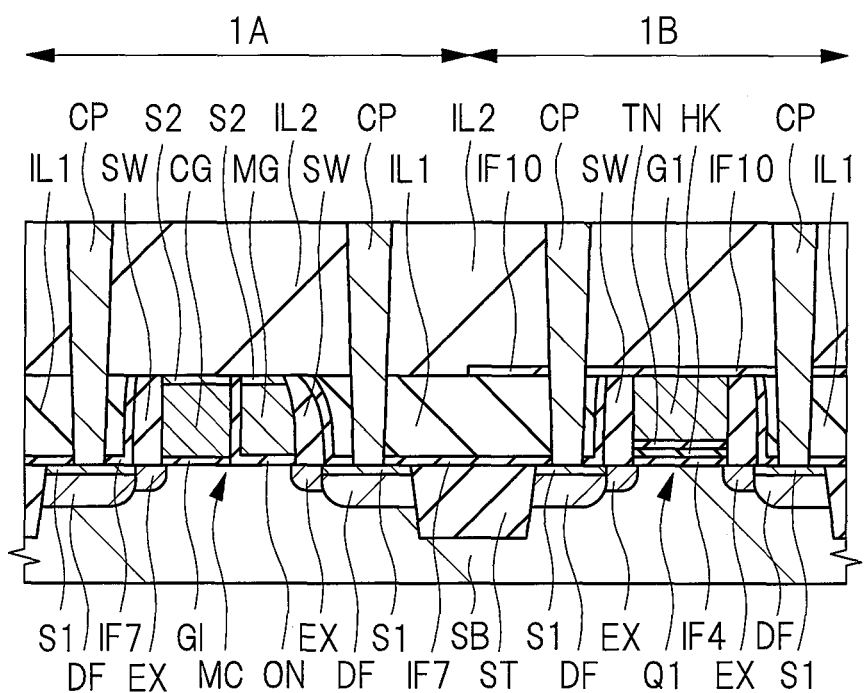
FIG. 22 is a cross-sectional view during the manufacturing process of the semiconductor device, continued from FIG. 21.

Next, as shown in FIG. 22, an interlayer insulating film and a plurality of contact plugs are formed. Here, first, the interlayer insulating film IL2 to cover the entire upper surface of the semiconductor substrate SB including the memory cell region 1A and the peripheral circuit region 1B is formed by using, for example, a CVD method. The interlayer insulating film IL2 is made of, for example, a silicon oxide film, and covers the upper surface of each of the control gate electrode CG, the memory gate electrode MG, the gate electrode GI, and the interlayer insulating film IL1.

Subsequently, the interlayer insulating films IL2 and IL1 and the insulating films IF10 and IF7 are dry-etched by using a resist film (not shown) formed on the interlayer insulating film IL2 by using a photolithography technique as an etching mask. In this manner, a plurality of contact holes (openings and through holes) penetrating the interlayer insulating film IL2 and a plurality of contact holes penetrating the interlayer insulating films IL1 and IL2 and the insulating film IF7 are formed. Note that the contact hole in the peripheral circuit region 1B penetrates the insulating film IF10.

At the bottom of each contact hole, parts of the main surface of the semiconductor substrate SB such as a part of the silicide layer S1 on the surface of the diffusion region DF, a part of the silicide layer S2 on the surface of the control gate electrode CG, a part of the silicide layer S2 on the surface of the memory gate electrode MG, a part of the gate electrode GI, or others is exposed. Note that the contact hole on each gate electrode is formed in a region not shown in FIG. 22.

Subsequently, in each contact hole, a conductive contact plug CP made of tungsten (W) or others is formed as a conductor for connection. In order to form the contact plug CP, a barrier conductor film (for example, a titanium film, a titanium nitride film, or a laminated film of them) is formed on, for example, the interlayer insulating film IL2 including the inside of the contact hole. Then, a main conductor film made of a tungsten film or others is formed on the barrier conductor film so as to completely fill the inside of each contact hole, and then, the unnecessary main conductor film and barrier conductor film outside the contact hole are removed by a CMP method, an etch back method, or others, so that the contact plug CP can be formed. Note that FIG. 22 integrally shows the barrier conductor film and the main conductor film (tungsten film) configuring the contact plug CP for simplification of the drawing.

The contact plug CP embedded in the contact hole is formed so as to be connected to the upper portion of each of the diffusion region DF, the control gate electrode CG, and the memory gate electrode MG or the gate electrode GI. That is, the contact plug CP is connected to the upper surface of the diffusion region DF of each of the memory cell MC and the MISFET Q1 via the silicide layer S1. In addition, the contact plug CP is connected to the upper surface of each of the control gate electrode CG and the memory gate electrode MG via the silicide layer S2.

One of the purposes of providing the silicide layers S1 and S2 is to reduce the contact resistance between the contact plug CP and the diffusion region DF made of a semiconductor, the control gate electrode CG, and the memory gate electrode MG. Therefore, no silicide layer is provided between the contact plug CP and the gate electrode G1 which is the metal gate electrode.

Thereafter, although not shown, a first wiring layer including the wiring of the first layer is formed on the interlayer insulating film IL2 in which the contact plug CP is embedded. The wiring can be formed by using a damascene technique. The first wiring layer includes an interlayer insulating film and a wiring of the first layer penetrating the interlayer insulating film. A plurality of wirings of the first layer are connected to the upper surface of each contact plug CP shown in FIG. 22. Then, a second wiring layer, a third wiring layer, and others are formed in this order on the first wiring layer, so that a laminated wiring layer is formed. Then, the semiconductor wafer is divided into individual pieces by a dicing process, so that a plurality of semiconductor chips are obtained. As described above, the semiconductor device of the present embodiment is manufactured.

<Operation of Nonvolatile Memory>

Next, an operation example of the nonvolatile memory will be described with reference to FIG. 23.

The memory cell of the present embodiment has a MISFET structure, and takes the charge storage state of the trapping insulating film in the gate electrode of the MISFET as the storage information, and reads the storage information as a threshold value of the transistor. The trapping insulating film means an insulating film capable of storing electric charges. As one example, a silicon nitride film or others can be cited. The threshold value of the MISFET is shifted by the injection and the discharge of the charge into and from such a charge storage region, so that a memory element operates. The nonvolatile semiconductor memory device using the trapping insulating film includes a split gate type MONOS memory as described in the memory cell of the present embodiment.

FIG. 23 is a table illustrating an example of voltage application condition to the respective portions of the selected memory cell at the time of "writing", "erasing", and "reading" according to the present embodiment. In the table in FIG. 23, the voltage Vmg applied to the memory gate electrode MG, the voltage Vs applied to the source region, the voltage Vcg applied to the control gate electrode CG, the voltage Vd applied to the drain region, and the base voltage Vb applied to the p-type well on the upper surface of the semiconductor substrate of the memory cell MC as shown in FIG. 22 are described for each of "writing", "erasing", and "reading". The term "selected memory cell" described here means a memory cell selected as a target for performing "writing", "erasing", or "reading".

In the example of the nonvolatile memory shown in FIG. 22, note that the active region on the right side of the memory gate electrode MG is the source region, and the active region on the left side of the control gate electrode CG is the drain region. In addition, the table in FIG. 23 shows a preferable example of voltage application conditions, and the conditions are not limited thereto and can be variously changed as necessary. In addition, in the present embodiment, the injection of electrons into the silicon nitride film NT which is the charge storage portion in the ONO film ON of the memory transistor is defined as "writing", and the injection of holes is defined as "erasing" (see FIG. 3).

In addition, in the table in FIG. 23, the column A corresponds to the case in which the writing method is the SSI method and the erasing method is the BTBT method, the column B corresponds to the case in which the writing method is the SSI method and the erasing method is the FN method, the column C corresponds to the case in which the writing method is the FN method and the erasing method is the BTBT method, and the column D corresponds to the case in which the writing method is the FN method and the erasing method is the FN method.

The SSI method can be regarded as an operation method of performing the writing on memory cells by injecting hot electrons into the silicon nitride film NT, the BTBT method can be regarded as an operation method of performing the erasing on memory cells by injecting hot holes into the silicon nitride film NT, and the FN method can be regarded as an operation method of performing the writing or erasing by electron or hole tunneling. In another expression regarding the FN method, the writing in the FN method can be regarded as an operation method of performing the writing on memory cells by injecting electrons into the silicon nitride film NT by FN tunnel effect, and the erasing in the FN method can be regarded as an operation method of performing the erasing on memory cells by injecting holes into the silicon nitride film NT by FN tunnel effect. This will be specifically described below.

The writing method includes a writing method (hot electron injection writing method) of performing the writing byahot electron injection based on a source side injection referred to as so-called an SSI (Source Side Injection) method and awritingmethod (tunneling writing method) of performing the writing by FN (Fowler Nordheim) tunneling referred to as so-called an FN method.

In the writing of the SSI method, the writing is performed by applying, for example, the voltages (Vmg=10 V, Vs=5 V, Vcg=1 V, Vd=0.5 V, and Vb=0 V) as shown in the "writing operation voltage" in the column A or the column B in the table in FIG. 23 to the respective portions of the selected memory cell to be written, and injecting electrons into the silicon nitride film NT in the ONO film ON of the selected memory cell.

At this stage, hot electrons are generated in the channel region (between the source and the drain) below a place between two gate electrodes (memory gate electrode MG and control gate electrode CG), and hot electrons are injected into the silicon nitride film NT which is the charge storage portion in the ONO film ON below the memory gate electrode MG. The injected hot electrons (electrons) are trapped in the trap level in the silicon nitride film NT in the ONO film ON. As a result, the threshold voltage of the memory transistor rises. That is, the memory transistor is in a writing state.

In the writing of the FN method, the writing is performed by applying, for example, the voltages (Vmg=−12 V, Vs=0 V, Vcg=0 V, Vd=0 V, and Vb=0 V) as shown in the "writing operation voltage" in the column C or the column D in the table in FIG. 23 to the respective portions of the selected memory cell to be written, and tunneling electrons from the memory gate electrode MG in the selected memory cell and injecting the electrons into the silicon nitride film NT in the ONO film ON. At this stage, the electrons tunnel through the silicon oxide film OX2 (see FIG. 3) from the memory gate electrode MG by the FN tunneling (FN tunnel effect) and are injected into the ONO film ON, and are trapped in the trap level in the silicon nitride film NT in the ONO film ON. As a result, the threshold voltage of the memory transistor rises. That is, the memory transistor is in a writing state.

In the writing in the FN method, note that the writing can also be performed by tunneling the electrons from the semiconductor substrate SB and injecting the electrons into the silicon nitride film NT in the ONO film ON. In this case, the writing operation voltages can be voltages obtained by, for example, reversing the positive and the negative of the "writing operation voltages" in the column C or D in the table in FIG. 23.

The erasing method includes an erasing method (hot hole injection erasing method) of performing the erasing by hot hole injection based on BTBT (Band-To-Band Tunneling) referred to as so-called the BTBT method and an erasing method (tunneling erasing method) of performing the erasing by FN (Fowler Nordheim) tunneling referred to as so-called the FN method.

In the erasing in the BTBT method, the erasing is performed by injecting the holes generated by BTBT into the charge storage portion (the silicon nitride film NT in the ONO film ON). For example, the voltages (Vmg=−6 V, Vs=6 V, Vcg=0 V, Vd=open, and Vb=0 V) as shown in the "erasing operation voltage" in the column A or the column C in the table in FIG. 23 are applied to the respective portions of the selected memory cell to be erased. As a result, the holes are injected into the silicon nitride film NT in the ONO film ON of the selected memory cell by generating the holes by the BTBT phenomenon and accelerating the electric field, so that the threshold voltage of the memory transistor is dropped. That is, the memory transistor is in an erasing state.

In the erasing of the FN method, for example, the erasing is performed by applying the voltages (Vmg=12 V, Vs=0 V, Vcg=0 V, Vd=0 V, and Vb=0 V) as shown in the "erasing operation voltage" in the column B or the column D in the table in FIG. 23 to the respective portions of the selected memory cell to be erased, and tunneling the holes from the memory gate electrode MG in the selected memory cell and injecting the holes into the silicon nitride film NT in the ONO film ON. At this stage, the holes tunnel through the silicon oxide film OX2 (see FIG. 3) from the memory gate electrode MG by FN tunneling (FN tunnel effect) and are injected into the ONO film ON, and are trapped in the trap level in the silicon nitride film NT in the ONO film ON. As a result, the threshold voltage of the memory transistor drops. That is, the memory transistor is in an erasing state.

In the erasing in the FN method, note that the erasing can also be performed by tunneling the holes from the semiconductor substrate SB and injecting the holes into the silicon nitride film NT in the ONO film ON. In this case, the erasing operation voltage can be, for example, voltages obtained by reversing the positive and the negative of the "erasing operation voltage" in the column B or D in the table in FIG. 23.

At the time of the reading, for example, the voltages as shown in the "reading operation voltage" of the column A, B, C, or D in the table in FIG. 23 are applied to the respective portions of the selected memory cell to be read. The writing state and the erasing state can be distinguished from each other by setting the voltage Vmg to be applied to the memory gate electrode MG at the time of the reading to the value between the threshold voltage of the memory transistor in the writing state and the threshold voltage in the erasing state.

<Effects of Present Embodiment>

Hereinafter, the manufacturing method of the present embodiment and the effects of the semiconductor device will be described.

In the MONOS memory, a resistance of a gate electrode can be reduced by using a silicide layer formed on the gate electrode made of a semiconductor film as a wiring. In addition, when the silicide layer formed in contact with the upper surface of the source/drain region of the MISFET has a tensile stress, the properties of the MISFET can be improved by a tensile stress being induced in the channel region. Specifically, the channel mobility can be improved. Therefore, the writing/erasing speed to/from the memory cell can be improved by increasing the tensile stress of the silicide layer on the source/drain region of each of the MISFETs configuring the memory cell and the peripheral circuit. In order to increase the tensile stress of the silicide layer, a method of performing the heat treatment for forming the silicide layer at a high temperature of, for example, about 450 to 600° C. can be considered in the manufacturing process of the semiconductor device.

Here, in the method of manufacturing the semiconductor device without performing the gate-last process, that is, the manufacturing method without forming the dummy gate electrode and without replacing the gate electrode, a silicide layer is formed also on the gate electrode of the MISFET in the process of forming the silicide layer on the source/drain region. When a semiconductor element is formed by this gate-first process, the process of polishing the upper portion of the gate electrode is not performed after the formation of the silicide layer, and therefore, the silicide layer in the upper portion of the gate electrode is left even after the completion of the semiconductor device.

In this case, a high tensile stress occurs also in the silicide layer on the gate electrode when the heat treatment at the time of forming the silicide layer is performed at a high temperature of, for example, about 450 to 600° C. in order to improve the properties of the MISFET by increasing the tensile stress of the silicide layer to be formed on the source/drain region. At this stage, when the MONOS memory is provided on the semiconductor substrate, a problem of decrease in the operation speed of the MONOS memory arises.

That is, the silicide layer in the upper portion of the gate electrode of the MISFET configuring the MONOS memory is used as a wiring for achieving the reduction in the resistance of the gate electrode. When the tensile stress of the silicide layer on the gate electrode becomes large as described above, the silicide layer becomes easy to disconnect. For this reason, by the disconnection of the silicide layer on the gate electrode of the MONOS memory, a problem of significant increase in the resistance value of the gate electrode to decrease the operation speed of the MONOS memory is caused. Thus, when the semiconductor device including the memory cell is formed by using the gate-first process, it is difficult to improve the properties of the element by applying the tensile stress to the element from the viewpoint of preventing the disconnection of the silicide layer.

Note that the silicide layer in the upper portion of each of the source/drain region of the MONOS memory and the gate electrode and source/drain region of the MISFET in the peripheral circuit region is not used as a wiring. In addition, the contact plug can be connected at shorter intervals to each of the source/drain region of the MONOS memory and the gate electrode and the source/drain region of the MISFET in the peripheral circuit region than an interval of the gate electrode of the MONOS memory. Therefore, even if the silicide layer in the upper portion of each of the source/drain region of the MONOS memory and the gate electrode and the source/drain region of the high- or low-breakdown MISFET in the peripheral circuit region is disconnected, a desired potential can be easily supplied to those electrode or source/drain regions, so that the problem of decrease in the properties of the element hardly arises.

However, a plurality of gate electrodes (control gate electrode and memory gate electrode) of the MONOS memory are densely arranged side by side in order to improve the degree of integration of the memory cells, and therefore, it is difficult to provide power supply portions for connecting the contact plug to the gate electrode at short intervals. Therefore, the distance between the plurality of contact plugs connected to the gate electrode becomes very large. Therefore, if the silicide layer on the gate electrode of the memory cell is not used as the wiring, the resistance of the gate electrode is increased, and the operation of the memory cell is delayed.

On the other hand, in the manufacturing process of the semiconductor device for forming MISFETs by using the gate-last process, a process is performed, the process forming gate electrodes or dummy gate electrodes of memory cells and other MISFETs, and forming a silicide layer on the source/drain region, and then, removing a part of the upper portions of those gate electrodes. At this stage, since the silicide layer on each gate electrode is removed, it is required to form the silicide layer again as the wiring on the gate electrode or as a relaxation layer for reducing the contact resistance between the gate electrode and the contact plug.

That is, when the semiconductor device is formed by the gate-last process, the silicide layer on the source/drain region and the silicide layer on the gate electrode can be formed in different processes from each other. The present inventor has focused on this, and has found that both the improvement in the properties of each semiconductor element and the prevention of the reduction in the operation speed of the memory cell are achieved by forming the silicide layer having a high tensile stress on the source/drain region and the silicide layer having a low tensile stress on the gate electrode of the memory cell in silicidation processes having different conditions from each other.

That is, in the process described with reference to FIGS. 13 and 14 in the present embodiment, a silicide layer S1 having a high tensile stress is formed on the source/drain region by performing the first heat treatment at the relatively high temperature. In this manner, the property of each of the memory cell MC of the MONOS memory (see FIG. 22) and the MISFET Q1 of the peripheral circuit region 1B (see FIG. 22) can be improved. At this stage, the silicide layer S1 having a high tensile stress is formed on the memory gate electrode MG. However, the silicide layer S1 on the memory gate electrode MG is removed by the polishing process described with reference to FIG. 16. For this reason, the silicide layer S1 that is easy to disconnect is not left on the memory gate electrode MG.

Then, in the process described with reference to FIGS. 20 and 21, by performing the second heat treatment at a relatively low temperature, a silicide layer S2 having a small tensile stress is formed on each of the control gate electrode CG and the memory gate electrode MG. That is, a silicide layer S2 that is difficult to disconnect can be formed on each of the control gate electrode CG and the memory gate electrode MG of the memory cell MC (see FIG. 22) of the MONOS memory.

Therefore, in the present embodiment, a silicide layer S1 having a high tensile stress can be formed on the source/drain region, and a silicide layer S2 having a low tensile stress can be formed on each of the control gate electrode CG and the memory gate electrode MG of the memory cell MC. For this reason, both of the improvement of the property of each semiconductor element including the memory cell MC and the MISFET Q1 and the prevention of the reduction in the operation speed of the memory cell MC can be achieved. In this manner, the performance of the semiconductor device can be improved, and the reliability of the semiconductor device can be improved.

In the present embodiment, an alloy of nickel (Ni) and platinum (Pt) reacts with a semiconductor to form the silicide layers S1 and S2, and therefore, the difference in the heat treatment temperature in the formation process between the silicide layer S1 and the silicide layer S2 and the difference in the tensile stress between the silicide layer S1 and the silicide layer S2 caused by the temperature can be determined by the difference in the segregation amount of platinum. This is because the difference in the segregation amount of platinum inside each of the silicide layers S1 and S2 is made by the difference in the temperature of the heat treatment performed for forming each of the silicide layers S1 and S2 as described above.

That is, while most of the platinum in the silicide layer S1 formed by the first heat treatment performed at a higher temperature diffuse downward in the silicide layer S1, the platinum in the silicide layer S2 formed by the second heat treatment performed at a temperature lower than that of the first heat treatment has a smaller amount of the downward diffusion in the silicide layer S2. Therefore, the amount of platinum per unit area on the lower surface of the silicide layer S1 is larger than the amount of platinum per unit area on the lower surface of the silicide layer S2, and the amount of platinum per unit area on the upper surface of the silicide layer S1 is smaller than the amount of platinum per unit area on the upper surface of the silicide layer S2. Therefore, the silicide layers S1 and S2 formed at different temperatures from each other are different from each other in the segregation amount of platinum as described above.

In the following, reasons why the property of the MISFET is changed and why the easiness of the disconnection of the silicide layer is changed by the occurrence of the difference in the segregation amount of platinum in the silicide layers will be described.

In the present embodiment, by forming the silicide layer S1 on the source/drain region at a high temperature, the segregation of platinum (Pt) is caused at the interface between the silicide layer S1 and the semiconductor substrate SB, so that form the NiSi film with (010) orientation is preferentially formed in the silicide layer S1. The present inventor has found through experiments that the NiSi film with (010) orientation becomes a film having a large tensile stress, and that the channel mobility of the n-channel type MISFET can be improved by applying a tensile stress from the silicide layer on the source/drain region to the channel of the n-channel type MISFET.

In addition, when the channel direction in the p-channel type MISFET is <100>, the mobility does not deteriorate because there is no stress sensitivity. In addition, when the channel direction in the p-channel type MISFET is <110>, the source/drain region has a convex structure made of SiGe having a height higher than the main surface of the semiconductor substrate, and therefore, the configuration of the present embodiment can be applied without the problem of degradation due to the stress.

The increase in the resistance due to the disconnection of the silicide layer on each of the control gate electrode and the memory gate electrode causes degradation of device properties. On the other hand, in the present embodiment, by forming the silicide layer S2 shown in FIG. 22 at a low temperature of 400° C. or lower, the segregation of platinum at the interface between the silicide layer S2 and the control gate electrode CG or memory gate electrode MG can be suppressed, so that the formation of (010) orientation can be prevented. That is, the number of (010) oriented grains per unit volume of the silicide layer S1 is larger than the number of (010) oriented grains per unit volume of the silicide layer S2. As a result, the silicide layer S2 having the smaller stress and the higher strength against the disconnection than those of the silicide layer S1 can be formed.

In addition, in the present embodiment, by using platinum for a part of the material of the silicide layers S1 and S2, the heat resistance of the silicide layers S1 and S2 is improved. In this manner, the disconnection of the silicide layer S2 on each of the control gate electrode CG and the memory gate electrode MG of the memory cell MC can be prevented.

In addition, as the reasons why the formation temperature of the silicide layer S2 on each of the control gate electrode CG and the memory gate electrode MG is lowered, the following reason is also cited. That is, the gate electrode G1 which is the metal gate electrode is formed in the peripheral circuit region 1B at the time of forming the silicide layer S2, and therefore, there is a risk of deterioration of the transistor because the metal in the gate electrode G1 diffuses into the gate insulating film of the MISFET Q1 by performing the second heat treatment at the time of forming the silicide layer S2 at a high temperature. In order to prevent such deterioration of the element, it is desirable to set the temperature at the time of forming the silicide layer S2 to a low temperature of 400° C. or lower.

<Regarding First Modification>

Figure 24:
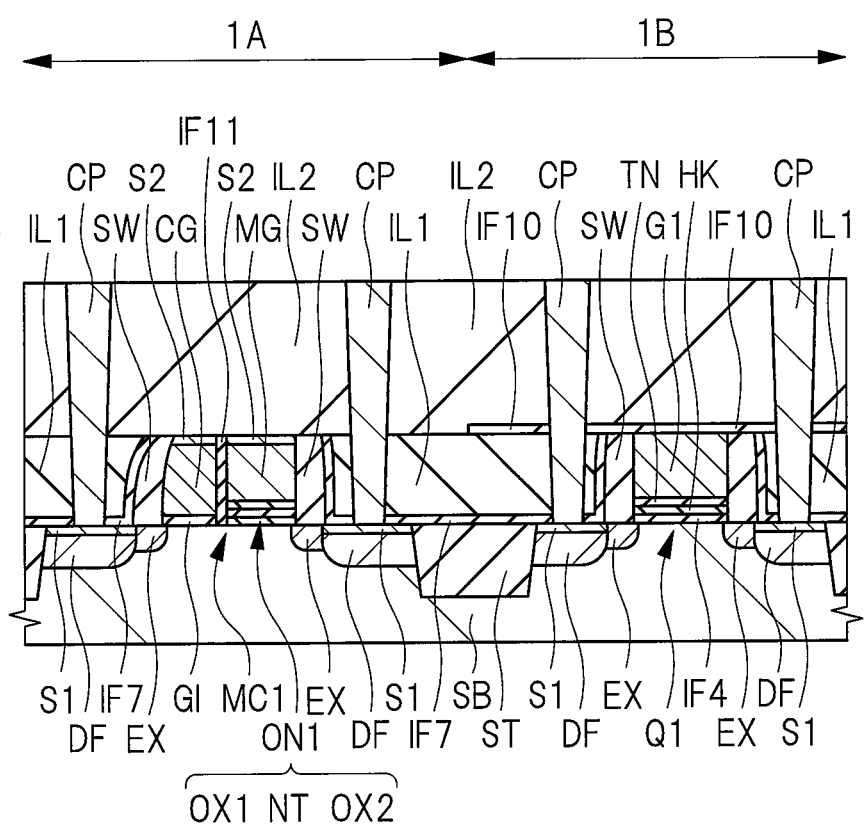
FIG. 24 is a cross-sectional view of a semiconductor device of a first modification of the first embodiment.

FIG. 24 shows a cross-sectional surface of a memory cell MC1 of a MONOS memory according to a first modification of the semiconductor device of the present embodiment. In FIG. 24, the memory cell region 1A and the peripheral circuit region 1B are shown as similar to FIG. 22.

The memory cell MC1 shown in FIG. 24 includes the control gate electrode CG and the memory gate electrode MG insulated from and adjacent to each other as similar to the memory cell MC shown in FIG. 22. In addition, an ONO film ON1 is formed between the memory gate electrode MG and the semiconductor substrate SB. Here, as different from FIG. 22, the laminated structure of the ONO film ON1 is shown. That is, the ONO film ON1 directly below the memory gate electrode MG is made of a laminated film of a silicon oxide film OX1, a silicon nitride film NT, and a silicon oxide film OX2 formed on the semiconductor substrate SB in this order.

On the other hand, between the control gate electrode CG and the memory gate electrode MG, not the ONO film ON1 but an insulating film IF11 not including a film functioning as a charge storage portion (for example, a silicon nitride film) is formed. The insulating film IF11 is made of, for example, a silicon oxide film.

That is, the present modification is different from the structure described with reference to FIG. 22 in that the insulating film IF11 formed between the control gate electrode CG and the memory gate electrode MG does not have the charge storage portion as different from the ONO film ON1 directly below the memory gate electrode MG. Therefore, the ONO film ON1 does not have an L-shaped cross section. Also here, Pt (platinum) segregates on the bottom surface of the silicide layer S1 more than the bottom surface of the silicide layer S2, so that the silicide layer S1 has higher tensile stress than that of the silicide layer S2. Thus, the semiconductor device including the memory cell MC1 including the ONO film ON1 and the insulating film IF11 can also obtain the same effect as the effect described with reference to FIGS. 1 to 22.

In the process of forming the structure of the present modification, for example, the following manufacturing method is used. That is, the memory gate electrode MG is formed by forming the ONO film ON1 and the polysilicon film on the semiconductor substrate SB in this order, and then, processing the polysilicon film and the ONO film ON1. Then, the memory gate electrode MG is covered by forming a sidewall-shaped insulating film IF11 with a relatively small film thickness on one sidewall of the memory gate electrode MG, and then, depositing a polysilicon film on the semiconductor substrate SB.

Then, by etching back the polysilicon film, a sidewall-shaped control gate electrode CG is formed on the sidewall of the memory gate electrode MG based on self alignment. As the subsequent processes, the formation process of the interlayer insulating film IL1, the polishing process of the upper surfaces of the control gate electrode CG and the memory gate electrode MG, and the formation process of each of the silicide layers S1 and S2 are performed as similar to the processes described with reference to FIGS. 16 to 22. In this manner, the structure shown in FIG. 24 can be obtained.

<Regarding Second Modification>

Figure 25:
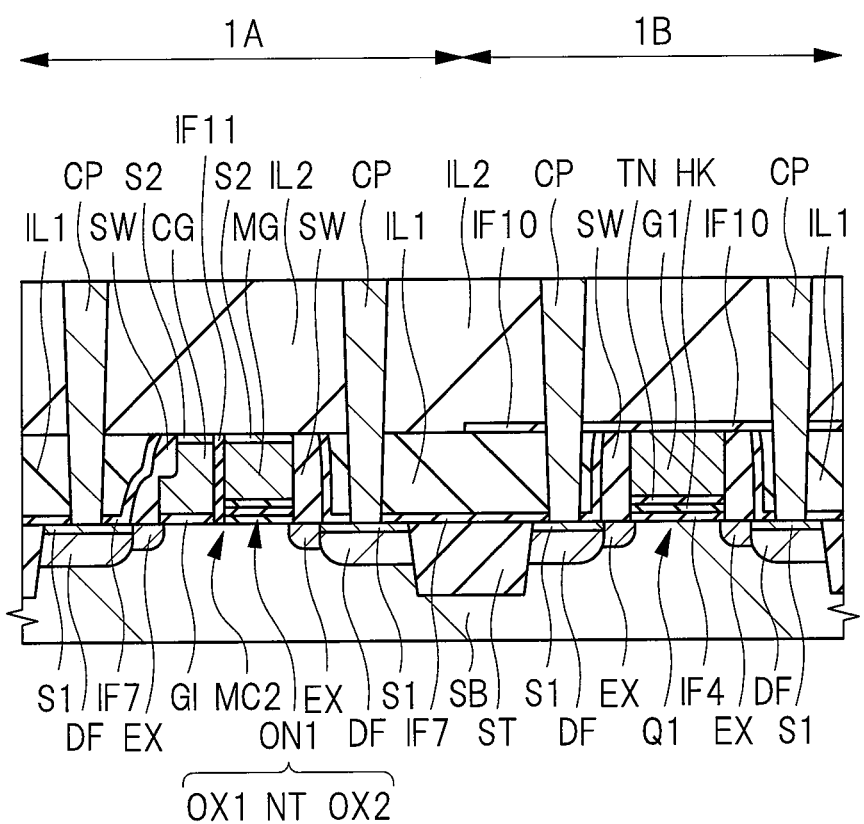
FIG. 25 is a cross-sectional view of a semiconductor device of a second modification of the first embodiment.

FIG. 25 shows a cross-sectional surface of a memory cell MC2 of a MONOS memory according to a second modification of the semiconductor device of the present embodiment. In FIG. 25, the memory cell region 1A and the peripheral circuit region 1B are shown as similar to FIG. 22.

As similar to the first modification, the memory cellMC2 shown in FIG. 25 includes an insulating film IF11 not including a charge storage portion between the control gate electrode CG and the memory gate electrode MG. The present modification is different from the structure shown in FIGS. 22 and 24 in that the control gate electrode is configured by a film deposited so as to be along the main surface of the semiconductor substrate SB and the sidewall of the memory gate electrode MG.

That is, in the present modification, a part of the control gate electrode CG extends along the upper surface of the semiconductor substrate SB, and the other part extends along the sidewall of the memory gate electrode MG. The control gate electrode CG with such a shape can be formed by increasing the width of the polysilicon film left by processing the polysilicon film to form the control gate electrode CG in the manufacturing process of the first modification. In addition, the control gate electrode CG with such a shape can be formed by decreasing the film thickness of the polysilicon film to be the control gate electrode CG by the process in the manufacturing process of the first modification.

Also here, Pt (platinum) segregates on the bottom surface of the silicide layer S1 more than the bottom surface of the silicide layer S2, and the silicide layer S1 has higher tensile stress than the silicide layer S2. Thus, the semiconductor device including the memory cell MC2 including the ONO film ON1 and the insulating film IF11 can also have the same effect as the effect described with reference to FIGS. 1 to 22.

<Regarding Third Modification>

Figure 26:
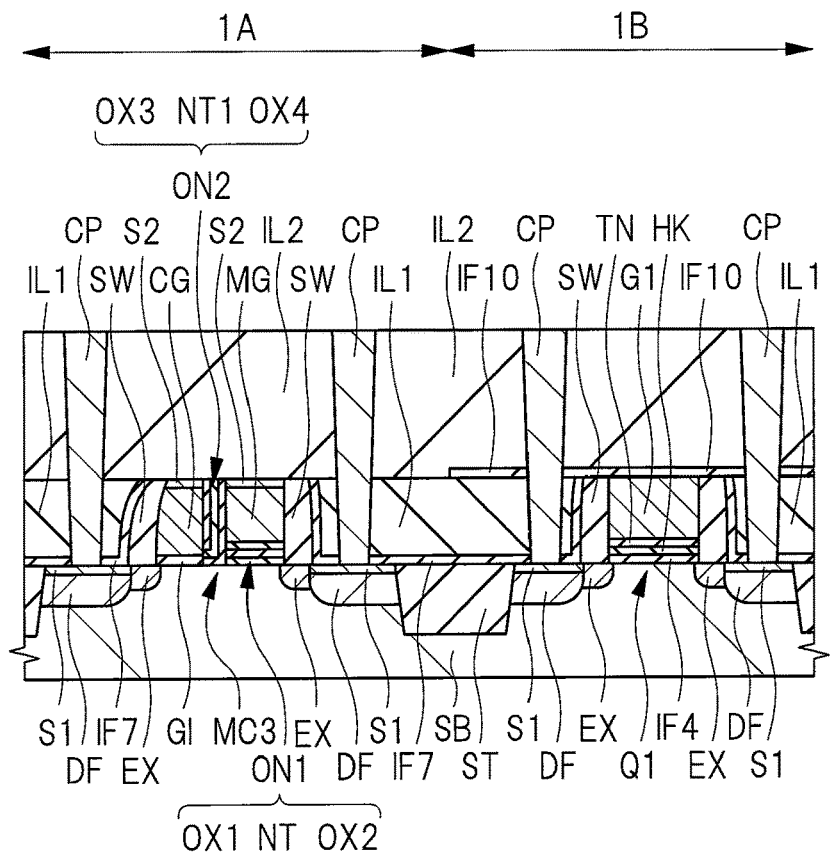
FIG. 26 is a cross-sectional view of a semiconductor device of a third modification of the first embodiment.

FIG. 26 shows a cross-sectional surface of a memory cell MC3 of a MONOS memory according to a third modification of the semiconductor device of the present embodiment. In FIG. 26, the memory cell region 1A and the peripheral circuit region 1B are shown as similar to FIG. 22.

As similar to the structure described with reference to FIG. 22, the memory cell MC3 shown in FIG. 26 includes an insulating film including a charge storage portion between the control gate electrode CG and the memory gate electrode MG and between the memory gate electrode MG and the semiconductor substrate SB. However, the ONO film ON2 provided between the control gate electrode CG and the memory gate electrode MG and the ONO film ON1 formed between the memory gate electrode MG and the semiconductor substrate SB are formed of different films from each other. In this point, the present modification is different from the structure shown in FIG. 22. That is, the ONO film ON2 provided between the control gate electrode CG and the memory gate electrode MG and the ONO film ON1 formed between the memory gate electrode MG and the semiconductor substrate SB are not integrated with each other, and therefore, the ONO film ON1 does not have the L-shaped cross section.

The structure of the memory cell MC3 of the present modification shown in FIG. 26 can be obtained by forming an ONO film ON2 instead of the insulating film IF11 (see FIG. 24) in the manufacturing process of the first modification. The ONO film ON2 is a film obtained by laminating a silicon oxide film OX3, a silicon nitride film NT1, and a silicon oxide film OX4 in this order from the sidewall of the memory gate electrode MG toward the sidewall side of the control gate electrode CG. Also here, Pt (platinum) segregates on the bottom surface of the silicide layer S1 more than the bottom surface of the silicide layer S2, and the silicide layer S1 has higher tensile stress than the silicide layer S2. Thus, the semiconductor device including the memory cell MC3 including the ONO films ON1 and ON2 can also obtain the same effect as the effect described with reference to FIGS. 1 to 22.

(Second Embodiment)

Figure 27:
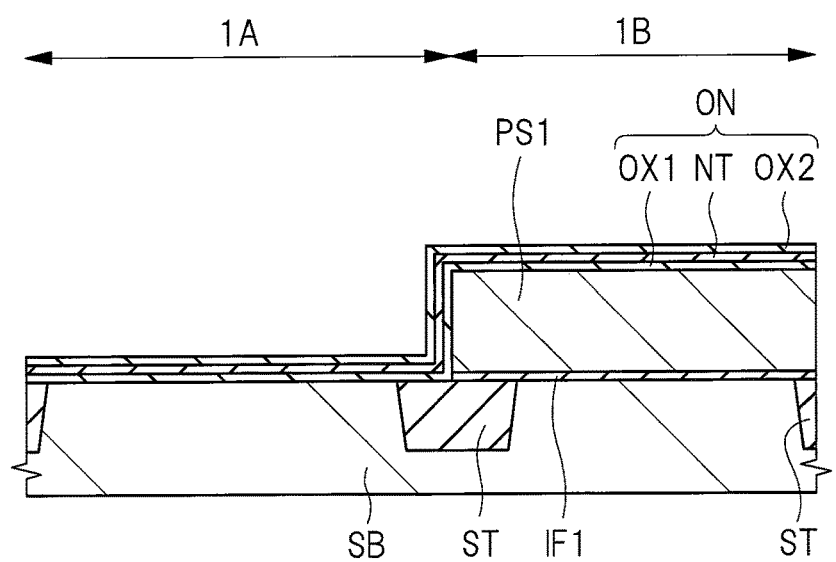
FIG. 27 is a cross-sectional view during a manufacturing process of a semiconductor device of a second embodiment.
Figure 28:
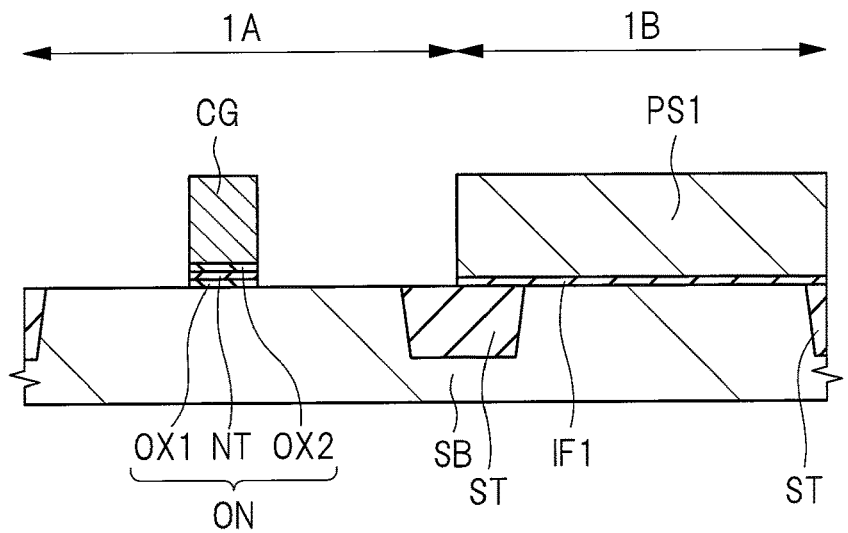
FIG. 28 is a cross-sectional view during the manufacturing process of the semiconductor device, continued from FIG. 27.
Figure 29:
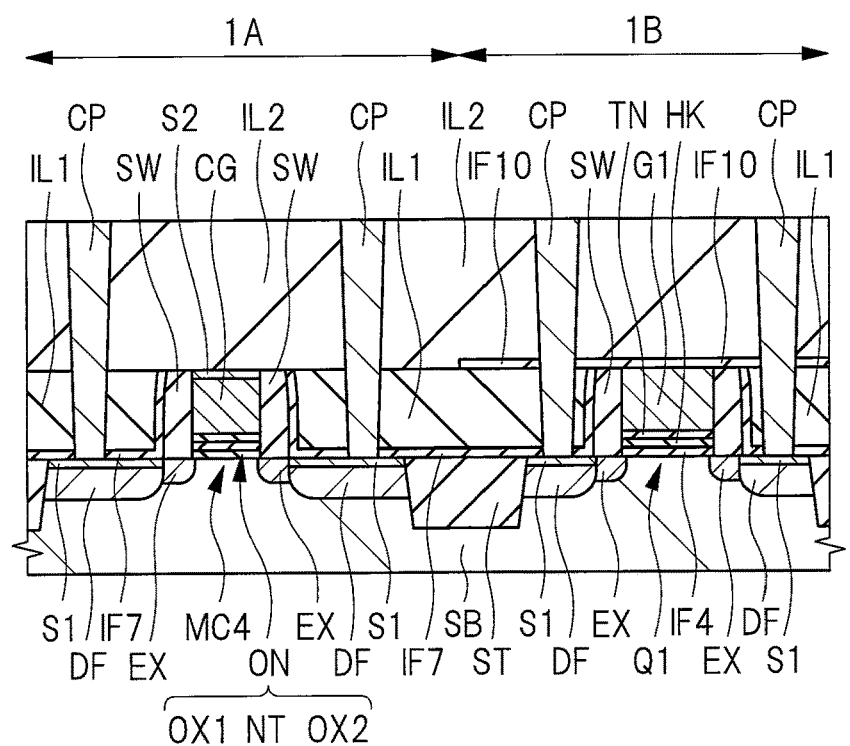
FIG. 29 is a cross-sectional view during the manufacturing process of the semiconductor device, continued from FIG. 28.

Hereinafter, as different from the first embodiment, formation of a single gate type MONOS memory and separation of the silicide layer on the source/drain region from the silicide layer in the upper portion of the single gate electrode will be described with reference to FIGS. 27 to 29. FIGS. 27 to 29 are cross-sectional views for explaining the manufacturing process of the semiconductor device of the present embodiment. In FIGS. 27 to 29, the memory cell region 1A and the peripheral circuit region 1B are shown as similar to FIGS. 1 to 22.

In the manufacturing process of the present embodiment, first, as shown in FIG. 27, an insulating film IF1 and a polysilicon film PS1 are formed on the semiconductor substrate SB in this order, and then, the polysilicon film PS1 and the insulating film IF1 are processed by using a photo-lithography technique and an etching method. As a result, the polysilicon film PS1 and the insulating film IF1 in the peripheral circuit region 1B are left, and the polysilicon film PS1 and the insulating film IF1 in the memory cell region 1A are removed. Then, an ONO film ON is formed on the entire main surface of the semiconductor substrate SB. The ONO film ON is a laminated film obtained by laminating the silicon oxide film OX1, the silicon nitride film NT, and the silicon oxide film OX2 in this order.

Next, as shown in FIG. 28, a control gate electrode CG made of the polysilicon film is formed in the memory cell region 1A by forming a polysilicon film on the ONO film ON, and then, processing the polysilicon film and the ONO film ON. At this stage, the ONO film ON is left between the control gate electrode CG and the semiconductor substrate SB, and the upper surface of the semiconductor substrate SB is exposed in the region not covered with the control gate electrode CG in the memory cell region 1A. In addition, the polysilicon film and the ONO film ON in the peripheral circuit region 1B are removed, so that the polysilicon film PS1 is exposed.

Next, as shown in FIG. 29, the semiconductor device of the present embodiment including the memory cell MC4 which is a single-gate type MONOS memory in the memory cell region 1A and including the MISFET Q1 in the peripheral circuit region 1B is formed by performing the same processes as those described with reference to FIGS. 11 to 22.

That is, after a dummy gate electrode is formed by the processing of the polysilicon film PS1 in the peripheral circuit region 1B, a sidewall and a source/drain region at a lateral position of each of the control gate electrode CG and the dummy gate electrode are formed, and then, a silicide layer S1 is formed on the source/drain region. Subsequently, the upper surface of each of the control gate electrode CG and the dummy gate electrode is exposed by forming an interlayer insulating film IL1 and polishing the upper surface of the interlayer insulating film IL1. At this stage, even if the silicide layer S1 is formed on the upper surface of the control gate electrode CG, the silicide layer S1 on the control gate electrode CG is removed by the polishing process.

Then, after the dummy gate electrode is removed to be replaced with a metal gate electrode, a silicide layer S2 having a small stress is formed on the upper surface of the control gate electrode CG. Subsequently, an interlayer insulating film IL2 and a plurality of contact plugs are formed. Thus, the structure shown in FIG. 29 is obtained.

As different from the first embodiment, the memory cell MC4 does not include a gate electrode except for the control gate electrode CG. For the writing operation and the erasing operation of the memory cell MC4, for example, the Fowler-Nordheim tunneling phenomenon is used. Note that the writing operation or the erasing operation can be performed by using hot electrons or hot holes. A high potential difference (about 12 V) is applied to the memory cell MC4 at the time of the writing operation on the memory cell MC4 or others, and therefore, the MONOS transistor configuring the memory cell MC4 is required to have a relatively high breakdown voltage.

Next, the erasing, writing, and reading operations on the memory cell MC4 will be described.

First, the erasing operation will be described. For example, a case of erasing data stored in the memory cell MC4 will be considered. The potential of the selected p-type well is set to 1.5 V, the potential of the control gate electrode CG is set to −8.5 V, the potential of the source region is set to 1.5 V, and the drain region is set to a floating state. Then, the charge stored in the charge storage portion below the control gate electrode CG of the memory cell MC4, that is, stored in the silicon nitride film NT is pulled out toward the semiconductor substrate SB, so that the data is erased.

Next, the writing operation will be described. For example, a case of writing data to the memory cell MC4 will be considered. The potential of the selected p-type well is set to −10.5 V, the potential of the control gate electrode CG is set to 1.5 V, the potential of the source region is set to −10.5 V, and the drain region is set to a floating state. Then, charges are injected into the charge storage portion below the control gate electrode CG, so that the data is written.

Next, the reading operation will be described. For example, it is assumed that data "1" is written to the memory cell MC4 so that the threshold voltage of the transistor is high. When the data of the memory cell MC4 is read, let the potential of the selected p-type well is set to −2 V, the potential of the control gate electrode CG is set to 0 V, the potential of the source region is set to 0 V, and the potential of the drain region is set to 1 V. Thus, the data of the memory cell MC4 is read. In this case, the threshold voltage of the memory cell MC4 in which the data "1" is written is higher than the threshold voltage of the memory cell MC4 in which the data "0" is written, and therefore, the information can be read.

In the present embodiment, a memory gate electrode is not provided as different from the first embodiment. However, the present embodiment can obtain the same effect as similar to that of the first embodiment.

That is, since the gate-last process is used, the silicide layer S1 on the source/drain region of each of the memory cell MC4 and the MISFET Q1 and the silicide layer S2 on the control gate electrode CG can be formed by different processes from each other.

Also here, Pt (platinum) segregates on the bottom surface of the silicide layer S1 more than the bottom surface of the silicide layer S2, and the silicide layer S1 has higher tensile stress than the silicide layer S2. Therefore, by making the tensile stress of the silicide layer S1 in contact with the source/drain region to be larger than that of the silicide layer S2 on the control gate electrode CG, the property of each transistor can be improved. In addition, by making the tensile stress of the silicide layer S2 on the control gate electrode CG to be smaller than that of the silicide layer S1 in contact with the source/drain region, the disconnection of the silicide layer S2 can be prevented.

In the foregoing, the invention made by the present inventor has been concretely described based on the embodiments. However, it is needless to say that the present invention is not limited to the foregoing embodiments and various modifications and alterations can be made within the scope of the present invention.

In addition, a part of the contents described in the embodiments will be described below.

(1) A semiconductor device includes a memory cell including: a semiconductor substrate; a first gate electrode formed on the semiconductor substrate via a first insulating film; a second gate electrode formed on a sidewall of the first gate electrode via a second insulating film having a charge storage portion inside; a first source/drain region formed on a main surface of the semiconductor substrate; a first silicide layer formed in contact with an upper surface of the first source/drain region; a second silicide layer formed in contact with an upper surface of the first gate electrode; and a third silicide layer formed in contact with an upper surface of the second gate electrode. The second gate electrode is formed on the semiconductor substrate via the second insulating film, the first to third silicide layers contain platinum, and an amount of platinum per unit area of a lower surface of the first silicide layer is larger than an amount of platinum per unit area of a lower surface of each of the second silicide layer and the third silicide layer.

(2) A semiconductor device includes a memory cell having: a semiconductor substrate; a first gate electrode formed on the semiconductor substrate via a first insulating film having a charge storage portion inside; a first source/drain region formed on a main surface of the semiconductor substrate; a first silicide layer formed in contact with an upper surface of the first source/drain region; and a second silicide layer formed in contact with an upper surface of the first gate electrode. The second gate electrode is formed on the semiconductor substrate via the second insulating film, the first and second silicide layers contain platinum, and an amount of platinum per unit area of a lower surface of the first silicide layer is larger than an amount of platinum per unit area of a lower surface of the second silicide layer.

(3) In the semiconductor device described in (2), a tensile stress of the first silicide layer is larger than a tensile stress of the second silicide layer.

EXPLANATION OF REFERENCE CHARACTERS 1A memory cell region
1B peripheral circuit region
CG control gate electrode
CP contact plug
DF diffusion region
EX extension region
G1 gate electrode
GI gate insulating film
HK insulating film
IF1 to IF10 insulating film
IL1, IL2 interlayer insulating film
MC memory cell
MG memory gate electrode
ON ONO film
Q1 MISFET
SB semiconductor substrate
S1, S2 silicide layer
ST element isolation region
SW sidewall
TN metal film

The invention claimed is:
1. A semiconductor device having a memory cell comprising:
   a semiconductor substrate;
   a first gate electrode formed on the semiconductor substrate via a first insulating film;
   a second gate electrode formed on the semiconductor substrate via the second insulating film having a charge storage portion inside so as to be adjacent to the first gate electrode;
   a third insulating film interposed between the first gate electrode and the second gate electrode;
   a first source/drain region formed on a main surface of the semiconductor substrate;
   a first silicide layer formed in contact with an upper surface of the first source/drain region;
   a second silicide layer formed in contact with an upper surface of the first gate electrode; and
   a third silicide layer formed in contact with an upper surface of the second gate electrode,
   wherein the first to third silicide layers contain platinum, and
   an amount of platinum per unit area of a lower surface of the first silicide layer is larger than an amount of platinum per unit area of a lower surface of each of the second silicide layer and the third silicide layer.
2. The semiconductor device according to claim 1, wherein a tensile stress of the first silicide layer is larger than a tensile stress of each of the second silicide layer and the third silicide layer.
3. The semiconductor device according to claim 1, wherein the first to third silicide layers have a polycrystalline structure, and
   a number of (010) oriented grains per unit volume in the first silicide layer is larger than a number of (010) oriented grains per unit volume in each of the second silicide layer and the third silicide layer.
4. The semiconductor device according to claim 1, wherein the first to third silicide layers contain platinum, and
   an amount of platinum per unit area of an upper surface of the first silicide layer is smaller than an amount of platinum per unit area of an upper surface of each of the second silicide layer and the third silicide layer.
5. The semiconductor device according to claim 1, further comprising a field effect transistor including:
   a metal gate electrode formed on the semiconductor substrate via a fourth insulating film;
   a second source/drain region formed on a main surface of the semiconductor substrate; and
   a fourth silicide layer formed in contact with an upper surface of the second source/drain region,
   wherein the first to fourth silicide layers contain platinum, and
   an amount of platinum per unit area of a lower surface of the fourth silicide layer is larger than an amount of platinum per unit area of a lower surface of each of the second silicide layer and the third silicide layer.
6. The semiconductor device according to claim 5, wherein a tensile stress of the fourth silicide layer is larger than a tensile stress of each of the second silicide layer and the third silicide layer.
7. The semiconductor device according to claim 5, wherein the first to fourth silicide layers have a polycrystalline structure, and
   a number of (010) oriented grains per unit volume in the fourth silicide layer is larger than a number of (010) oriented grains per unit volume in each of the second silicide layer and the third silicide layer.
8. The semiconductor device according to claim 5, wherein the first to fourth silicide layers contain platinum, and
   an amount of platinum per unit area of an upper surface of the fourth silicide layer is smaller than an amount of platinum per unit area of an upper surface of each of the second silicide layer and the third silicide layer.

* * * * *